(12) United States Patent
Chang et al.

(10) Patent No.: US 11,776,896 B2
(45) Date of Patent: Oct. 3, 2023

(54) CAPACITOR DEVICE AND MANUFACTURING METHOD THEREOF

(71) Applicant: Taiwan Semiconductor Manufacturing Company, Ltd., Hsinchu (TW)

(72) Inventors: Jen-Yuan Chang, Hsinchu (TW); Chia-Ping Lai, Hsinchu (TW); Chien-Chang Lee, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 163 days.

(21) Appl. No.: 17/219,282

(22) Filed: Mar. 31, 2021

(65) Prior Publication Data
US 2022/0319979 A1 Oct. 6, 2022

(51) Int. Cl.
*H01L 23/522* (2006.01)
*H01L 49/02* (2006.01)
*H01L 23/532* (2006.01)

(52) U.S. Cl.
CPC .... *H01L 23/5223* (2013.01); *H01L 23/53266* (2013.01); *H01L 28/91* (2013.01)

(58) Field of Classification Search
CPC .... H01L 28/91; H01L 29/945; H01L 27/0805
See application file for complete search history.

(56) References Cited

U.S. PATENT DOCUMENTS

| 2013/0161792 A1* | 6/2013 | Tran | H01L 29/66083 438/386 |
| 2014/0145299 A1* | 5/2014 | Kalnitsky | H01L 29/945 257/532 |
| 2014/0374880 A1* | 12/2014 | Chen | H01L 27/10829 257/532 |

* cited by examiner

*Primary Examiner* — John A Bodnar
(74) *Attorney, Agent, or Firm* — Harrity & Harrity, LLP

(57) ABSTRACT

Some implementations described herein provide a semiconductor structure. The semiconductor structure includes a capacitor device within a recessed portion of a substrate. The recessed portion has sidewalls and a bottom surface below a top surface of the substrate. The semiconductor structure includes a dielectric material disposed below the capacitor device and within the recessed portion. The semiconductor structure includes a first conductive structure adjacent one or more of the sidewalls of the recessed portion. The first conductive structure may include a conductive portion of the substrate or a conductive material disposed within the recessed portion. The semiconductor structure includes a second conductive structure coupled to the first conductive structure, where the second conductive structure provides an electrical connection from the first conductive structure to a voltage source or a voltage drain.

20 Claims, 22 Drawing Sheets

CAPACITOR DEVICE AND MANUFACTURING METHOD THEREOF

BACKGROUND

A capacitor device may be used to generate an electric field across a dielectric structure disposed between electrodes. The capacitor device may store electrical energy between the electrodes of the capacitor device based on generation of the electric field, and based on the dielectric prohibiting, or nearly prohibiting, current flow between the electrodes. The capacitor device may be used in a semiconductor structure to store electrical energy, to form random-access memory (e.g., dynamic random-access memory), to stabilize power flow, and/or to tune circuits to particular frequencies, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
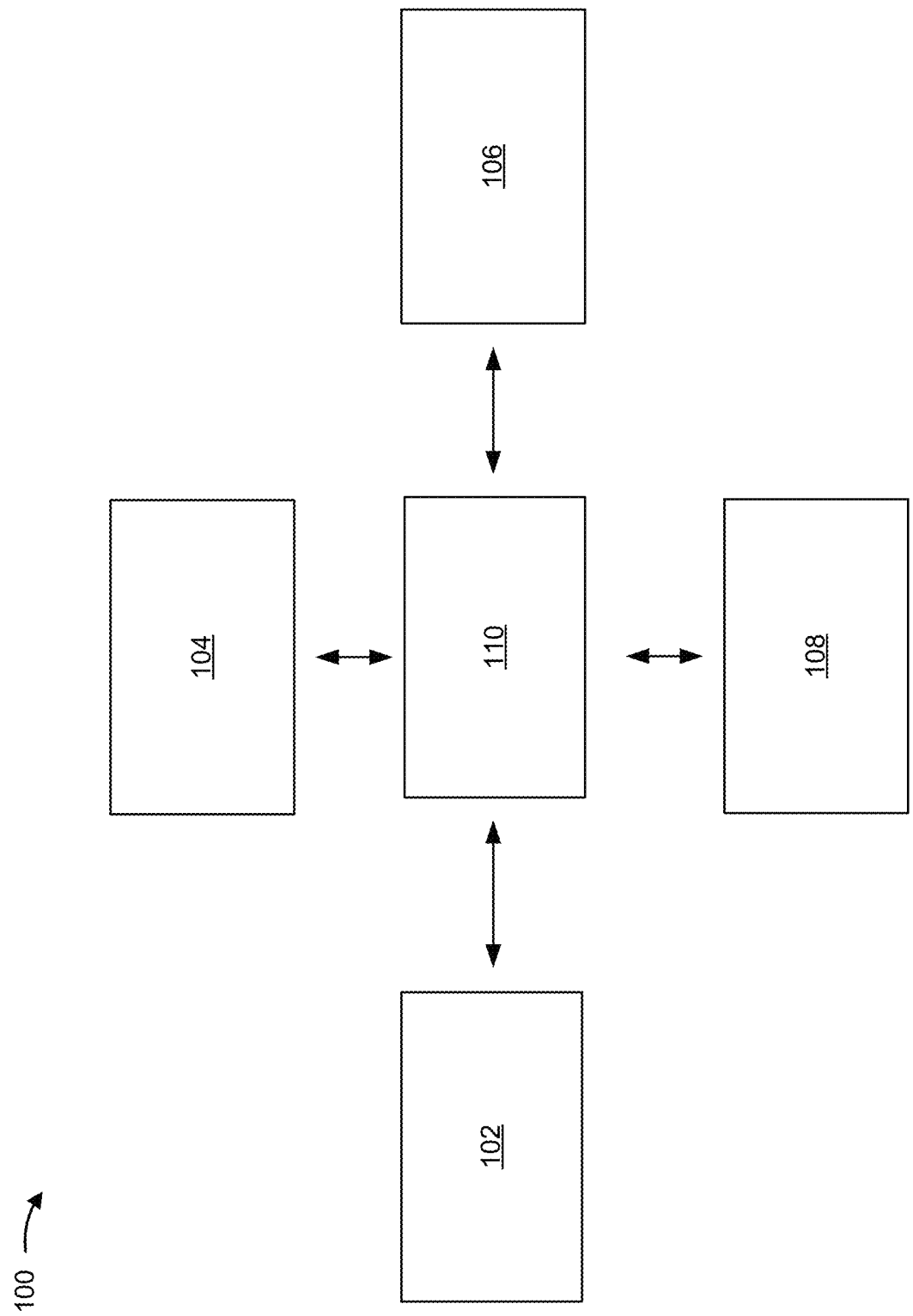
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a capacitor device may be formed within a semiconductor structure. For example, the capacitor device may be formed within a recessed portion of a substrate of the semiconductor structure. The capacitor device may include a first set of electrodes configured to receive a positive charge and a second set of electrodes configured to receive a negative charge. The capacitor device may be configured with an increased capacitance based on including multiple electrodes that alternate, within the recessed portion, between positively charged electrodes (e.g., electrodes coupled to, or configured to be coupled to, a positive voltage) and negatively charged electrodes (e.g., electrodes coupled to, or configured to be coupled to, a negative voltage). In other words, the capacitor device may include stacked electrodes that alternate between positively charged electrodes and negatively charged electrodes. However, the capacitor device may generate parasitic capacitance outside of the recessed portion of the substrate. This parasitic capacitance may decrease an effective capacitance of the capacitor device and/or may induce an electric field in the substrate.

Some implementations described herein provide techniques and apparatuses for a semiconductor structure that includes a capacitor device disposed within a recessed portion of a substrate and a conductive structure disposed adjacent to a sidewall of the recessed portion of the substrate. In some implementations, the conductive structure includes a conductive portion of the substrate. In some implementations, the conductive structure may include a conductive material disposed within the recessed portion of the substrate. The conductive structure may be coupled to another conductive structure (e.g., extending from a top surface of the substrate) that provides an electrical connection from the conductive structure to a voltage source or voltage drain.

Based on disposing the conductive structure adjacent to the sidewall of the recessed portion of the substrate, the conductive structure may collect and/or drain charge (e.g., drain electrons or deliver electrons, among other examples) to reduce a charge accumulation within the substrate. Based on reducing the charge accumulation within the substrate, the semiconductor structure may have a reduced parasitic capacitance and/or an increased effective capacitance.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, an ion implantation tool 108, and/or another type of semiconductor processing tool. The semiconductor processing tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor structure. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotopically or directionally etch the one or more portions), or another type of dry etching technique.

The planarization tool 106 is a semiconductor processing tool that is capable of polishing or planarizing various layers of a wafer or semiconductor structure. For example, the planarization tool 106 may include a chemical mechanical planarization (CMP) tool and/or another type of planarization tool 106 that polishes or planarizes a layer or surface of deposited or plated material. The planarization tool 106 may polish or planarize a surface of a semiconductor structure with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor structure). The polishing pad and the semiconductor structure may be pressed together by a dynamic polishing head and held in place by the retaining ring. The dynamic polishing head may rotate with different axes of rotation to remove material and even out any irregular topography of the semiconductor structure, making the semiconductor structure flat or planar.

The ion implantation tool 108 is a semiconductor processing tool that is used to implant ions into a substrate such as a semiconductor wafer. The ion implantation tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, or another location. In some implementations, wafer/die transport tool 110 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
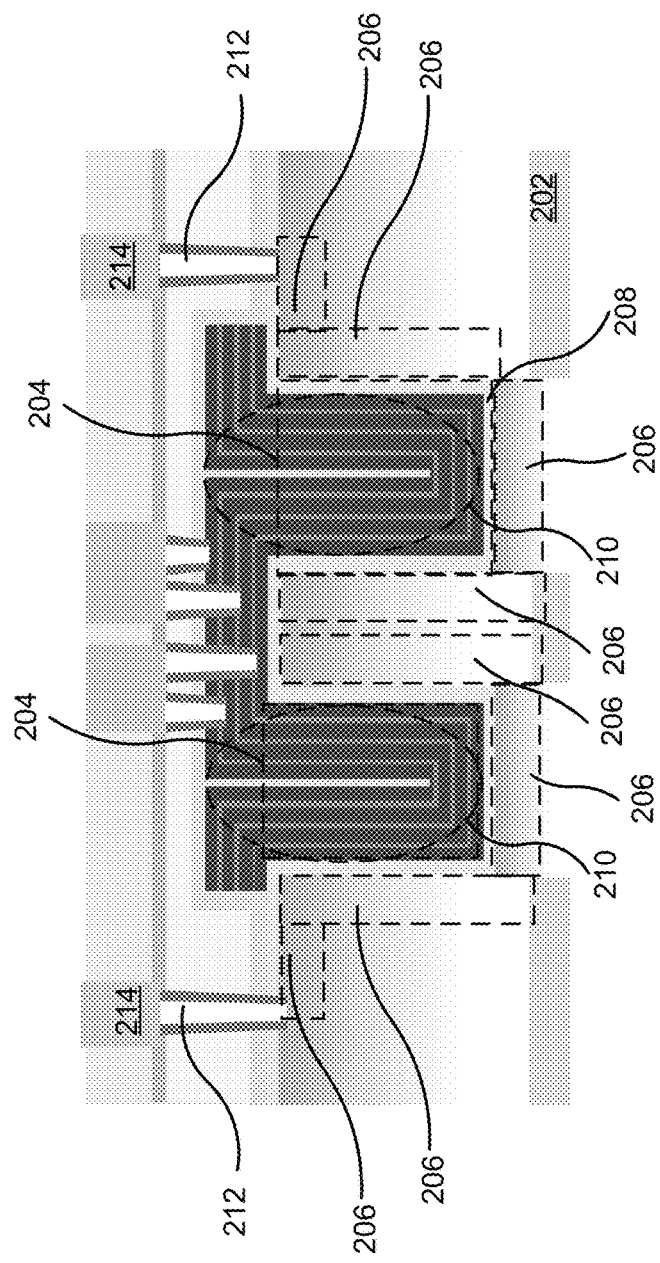
FIG. 2 is a diagram of an example semiconductor structure described herein.

FIG. 2 is a diagram of an example semiconductor structure 200 described herein. In some implementations, the semiconductor structure 200 includes one or more layers not shown in FIG. 2, such as one or more barrier layers, adhesion layers, metal gates, substrates, interconnects, recesses (e.g., vias), or semiconductor structures, among other examples.

As shown in FIG. 2, the semiconductor structure 200 may include a substrate 202. In some implementations, the substrate 202 includes a silicon-based material (e.g., $SiO_2$ or silicon carbide, among other examples). The substrate 202 may include one or more recessed portions 204, each having sidewalls and a bottom surface below a top surface of the substrate 202. The substrate 202 may include one or more conductive portions 206 disposed around (e.g., adjacent to) at least one of the one or more recessed portions 204 (e.g., directly contacting one or more sidewalls and/or a bottom surface of the one or more recessed portions 204). In some implementations, the one or more conductive portions 206 are conductive based on having ions implanted within the one or more conductive portions 206. For example, ion implantation may be performed by performing p-type doping (e.g., implantation of boron) or n-type doping (e.g., implantation of phosphorus) to form a doped silicon material in the one or more conductive portions 206. In some implementations, based on doping the silicon material, the one or more conductive portions 206 have increased conductivity (e.g., electrical conductivity) in comparison with other portions of the substrate 202.

The semiconductor structure 200 may include a dielectric material 208 disposed within the one or more recessed portions 204. In some implementations, the dielectric material 208 includes a low-k material, such as silicon dioxide, silicon nitride, or silicon oxynitride, among other examples. The dielectric material 208 may form a liner within the one or more recessed portions 204 and/or may extend onto the top surface of the substrate 202. In some implementations, the dielectric material 208 provides electrical insulation between the substrate 202 and structures, layers, and/or materials disposed above the dielectric material 208 (e.g., electrodes of a capacitor device 210).

The semiconductor structure 200 may include a capacitor device 210 disposed on the dielectric material 208 within the one or more recessed portions 204. The capacitor device 210 may include a first set of electrodes (shown in FIGS. 3D-3J as a set of electrodes 302) having a positive charge and a second set of electrodes having a negative charge. In some implementations, the first set of electrodes and/or the second set of electrodes include a conductive material, such as titanium nitride-based material, tantalum nitride-based material, tantalum-based material, and/or titanium-based material, among other examples.

The capacitor device 210 may include a set of layers of high-k dielectric material (shown in FIGS. 3D-3J as a set of dielectric layers 304) that separate the first set of electrodes having the positive charge from the second set of electrodes having the negative charge. In some implementations, the high-k dielectric material includes silicon monoxide-based material, zirconium oxide-based material, silicon oxide-based material, silicon nitride-based material, and/or aluminum oxide-based material, among other examples. In some implementations, the high-k dielectric material includes a structure that includes multiple layers of dielectric material (e.g., a silicon oxide-silicon nitride-silicon oxide (ONO) structure).

The semiconductor structure 200 may include a conductive structure 212 coupled to the one or more conductive portions 206 of the substrate 202. The conductive structure 212 may include a metal material (e.g., a tungsten-based material, a ruthenium-based material, a copper-based material, and/or a cobalt-based material, among other examples), one or more liners or barriers (e.g., an adhesion layer, titanium nitride-based material, tantalum nitride-based material, tantalum-based material, and/or titanium-based material, among other examples). In some implementations, the conductive structure may be insulated from additional metal conductive structures of the semiconductor structure 200 by an insulating layer 212A on side surfaces of the conductive structure 212. For example, the dielectric layer (e.g., a semiconductor layer) may be disposed between the conductive structure 212 and one or more metal elements of the capacitor device 210. The conductive structure 212 may be electrically coupled to a metal material on a bottom surface of the conductive structure. In some implementations, the conductive structure 212 is laterally displaced from the capacitor device 210 and/or the one or more recessed portions 204.

In some implementations, the conductive structure 212 provides an electrical connection from the conductive portion 206 of the substrate 202 to a voltage source 214 or a voltage drain 214 (referred to herein as "voltage source/drain 214"). In some implementations, the voltage source/drain 214 includes a bit line, such as a copper bit line, that connects to an input voltage or a ground. In some implementations, the voltage source/drain 214 is coupled to a matching circuit that controls positive or negative poles to reduce a parasitic capacitance of the semiconductor structure 200. A voltage of the voltage source may be based on a voltage applied to a bottom electrode of the capacitor device 210. For example, the matching circuit may provide a positive voltage to the voltage source/drain 214 based on the bottom electrode of the capacitor device 210 (e.g., an outer electrode that is closest to the sidewall and/or bottom surface of the one or more recessed portions 204) having a negative charge. Alternatively, the matching circuit may provide a negative voltage to the voltage source/drain 214 based on the bottom electrode of the capacitor device 210 having a positive charge.

As shown in FIG. 2, the semiconductor structure 200 may include multiple (e.g., two) recessed portions 204 of the substrate 202, each having sidewalls and a bottom surface below the top surface of the substrate 202. The dielectric material 208 may be disposed within the multiple recessed portions 204 and/or the capacitor device 210 may be disposed on the dielectric material 208 within the multiple recessed portions 204 of the substrate 202. In some implementations, the one or more conductive portions 206 includes one or more conductive portions 206 of the substrate 202 disposed around the multiple recessed portions 204. For example, the one or more conductive portions 206 may be disposed adjacent to sidewalls (e.g., some sidewalls or all sidewalls) of the multiple recessed portions 204 (e.g., each of the multiple recessed portions 204) of the substrate 202.

Based on disposing the conductive portion 206 of the substrate 202 adjacent to the sidewall(s) of the one or more recessed portions 204 of the substrate 202, the conductive portion 206 may collect and/or drain charge to reduce a charge accumulation within the substrate 202. Based on reducing the charge accumulation within the substrate 202, the semiconductor structure 200 may have a reduced parasitic capacitance and/or an increased effective capacitance.

As shown in FIG. 2, the semiconductor structure 200 may include one or more additional conductive structures 212. The one or more additional conductive structures 212 may be coupled to one or more voltage source/drains 214 (e.g., with a common voltage or with different voltages). In some implementations, a first conductive structure 212 is laterally displaced from the capacitor device 210 in a first lateral direction and a second conductive structure 212 is laterally displaced from the capacitor device 210 in a second lateral direction. For example, the first conductive structure 212 may be positioned on a first side of the capacitor device 210 and the second conductive structure 212 may be positioned on a second side of the capacitor device 210 (e.g., generally opposite from the first side), and/or the capacitor device 210 may be positioned generally between the conductive structure 212 and the additional conductive structure 212. In some implementations, a third conductive structure 212 is disposed between a first recessed portion 204 and a second recessed portion 204. Based on including multiple conductive structures 212, the semiconductor structure 200 may collect and/or drain charge, with improved efficiency, to reduce a charge accumulation within the substrate 202. For example, based on a conductivity of the one or more conductive portions 206 of the substrate 202 and/or a width of the one or more recessed portions 204, multiple conductive structures 212 may collect and/or drain charge from opposite sides of the one or more recessed portions 204 with improved efficiency and/or efficacy when compared with a semiconductor structure 200 having only one conductive structure 212.

As indicated above, FIG. 2 is provided as an example. Other examples may differ from what is described with regard to FIG. 2. Other examples may differ from what is described with regard to FIG. 2. The number and arrangement of devices, layers, and/or materials shown in FIG. 2 is provided as an example. In practice, there may be additional devices, layers, and/or materials, fewer devices, layers, and/or materials, different devices, layers, and/or materials, or differently arranged devices, layers, and/or materials than those shown in FIG. 2.

FIGS. 3A-3J are diagrams of an example implementation 300 described herein. Example implementation 300 may be an example process for forming a semiconductor structure 200. FIGS. 3A-3J show a semiconductor structure 200 having a capacitor device 210 disposed within a single recessed portion 204 of a substrate 202. However, the semiconductor structure 200 may have a capacitor device 210 disposed within multiple recessed portions 204 of the substrate 202 and/or on a top surface of the substrate 202 between the multiple recessed portions 204 (e.g., as shown in FIG. 2). The implementation 300 may be applied to forming a semiconductor device 200 having a single recessed portion 204 or multiple recessed portions 204. The semiconductor structure 200 may include one or more additional devices, structures, and/or layers not shown in FIGS. 3A-3J.

Figure 3A:
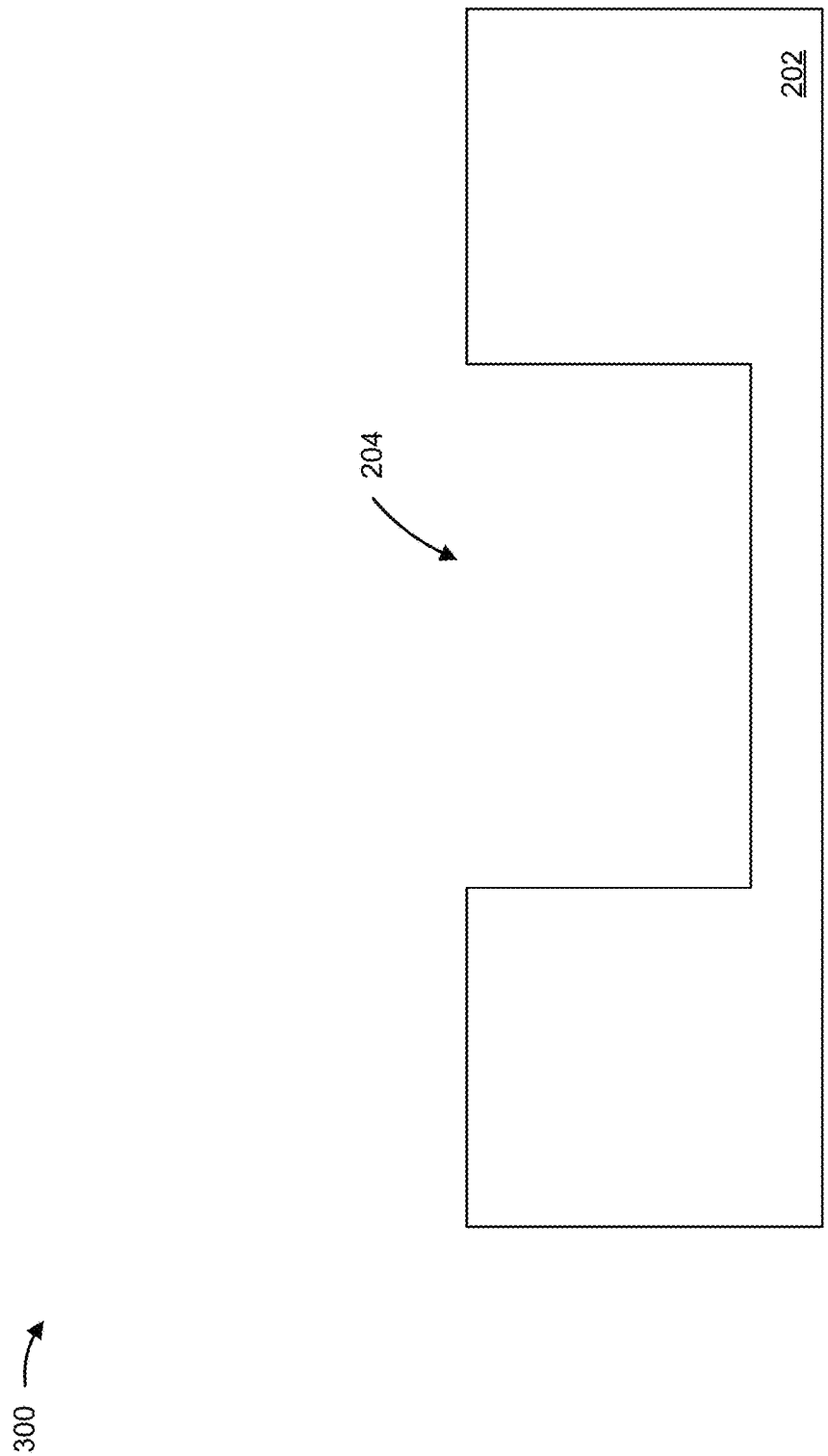
FIGS. 3A-3J are diagrams of an example implementation described herein.

As shown in FIG. 3A, example implementation 300 may include forming a substrate 202 having a recessed portion 204. In some implementations, a deposition tool (e.g., deposition tool 102) deposits the substrate 202 on a lower layer of the semiconductor structure 200. In some implementations, the deposition tool uses chemical vapor deposition or physical vapor deposition, among other examples, to deposit the substrate 202 onto the lower layer of the semiconductor structure 200. In some implementations, another semiconductor processing tool may form and/or cut the substrate 202 in preparation for forming the semiconductor structure 200.

In some implementations, an etching tool (e.g., etching tool 104) may remove a portion of the substrate 202 to form the recessed portion 204. In some implementations, one or more semiconductor processing tools may perform processes to etch the portion of the substrate 202 using multiple steps. For example, the deposition tool may deposit a photoresist on one or more portions of a top surface of the substrate 202 before an etching tool performs an etching process to remove the portion of the substrate 202 that is not covered with the photoresist.

Figure 3B:
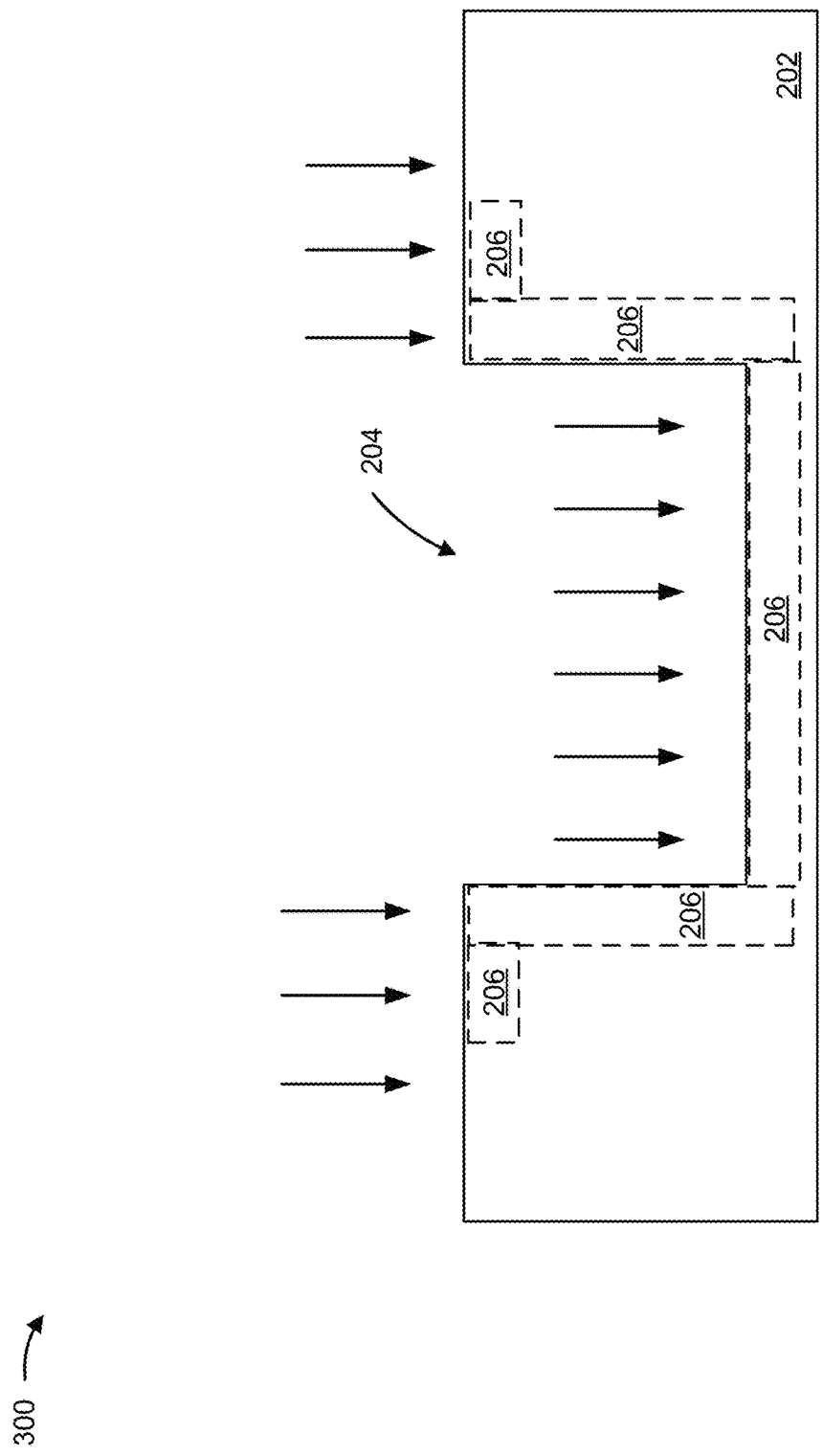

As shown in FIG. 3B, example implementation 300 may include doping the substrate 202 to form one or more conductive portions 206 of the substrate 202. For example, an ion implantation tool (e.g., ion implantation tool 108) may implant ions into the substrate 202 at the one or more portions 206. In some implementations, the ions include ions (e.g., boron or phosphorus, among other examples) for p-doping the one or more conductive portions 206 and/or ions for n-doping the one or more conductive portions 206.

Figure 3C:
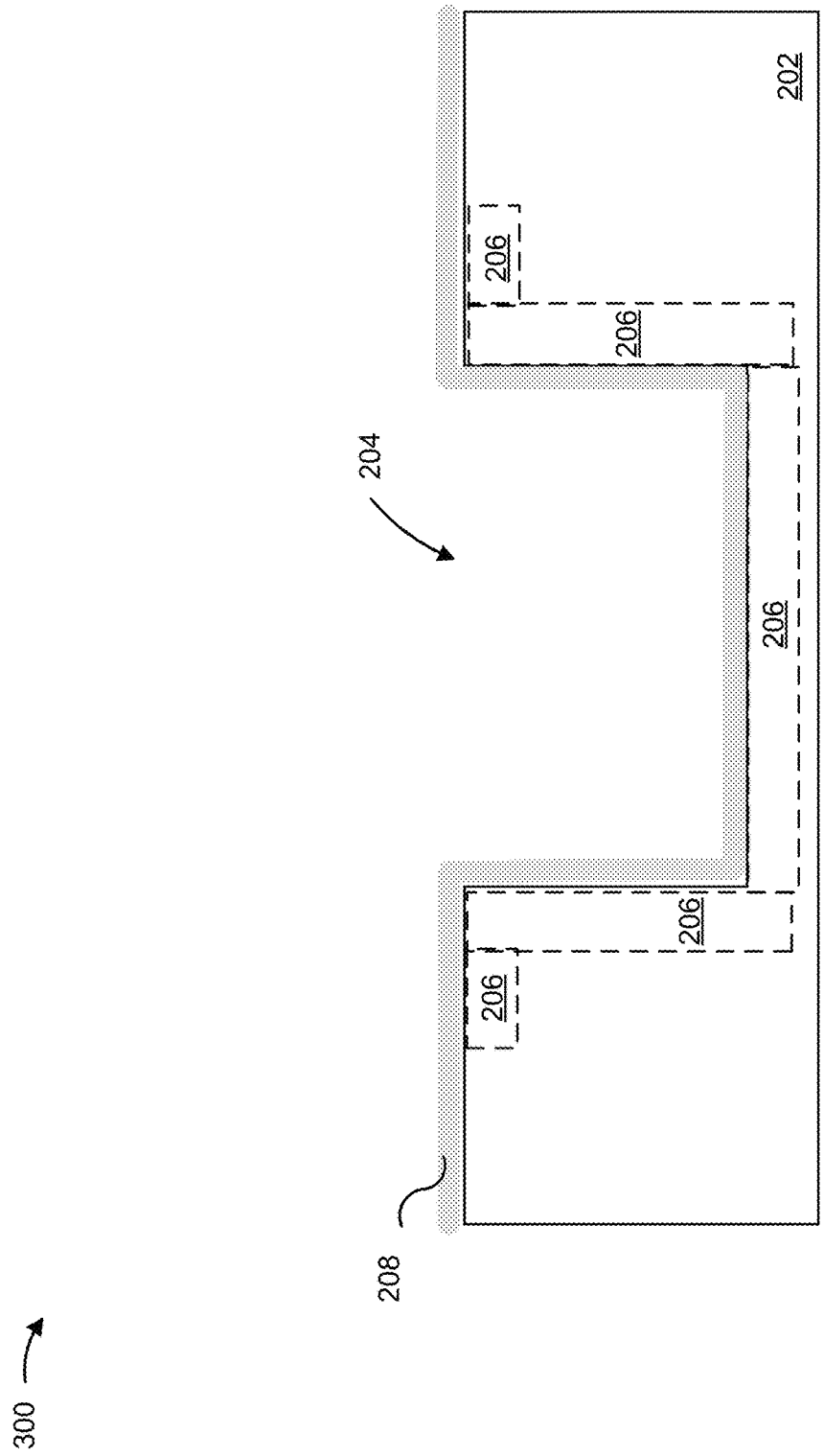

As shown in FIG. 3C, example implementation 300 may include forming a dielectric material 208 within the recessed portion 204 and/or on a top surface of the substrate 202. In some implementations, a deposition tool (e.g., deposition tool 102) deposits dielectric material 208 on the substrate 202 of the semiconductor structure 200. In some implementations, the deposition tool uses chemical vapor deposition or physical vapor deposition, among other examples, to deposit the dielectric material 208 within the recessed portion 204 and/or onto a top surface of the substrate 202. In some implementations, a planarization tool (e.g., planarization tool 106) may polish and/or planarize an upper surface of the dielectric material 208 after depositing the dielectric material 208.

Figure 3D:
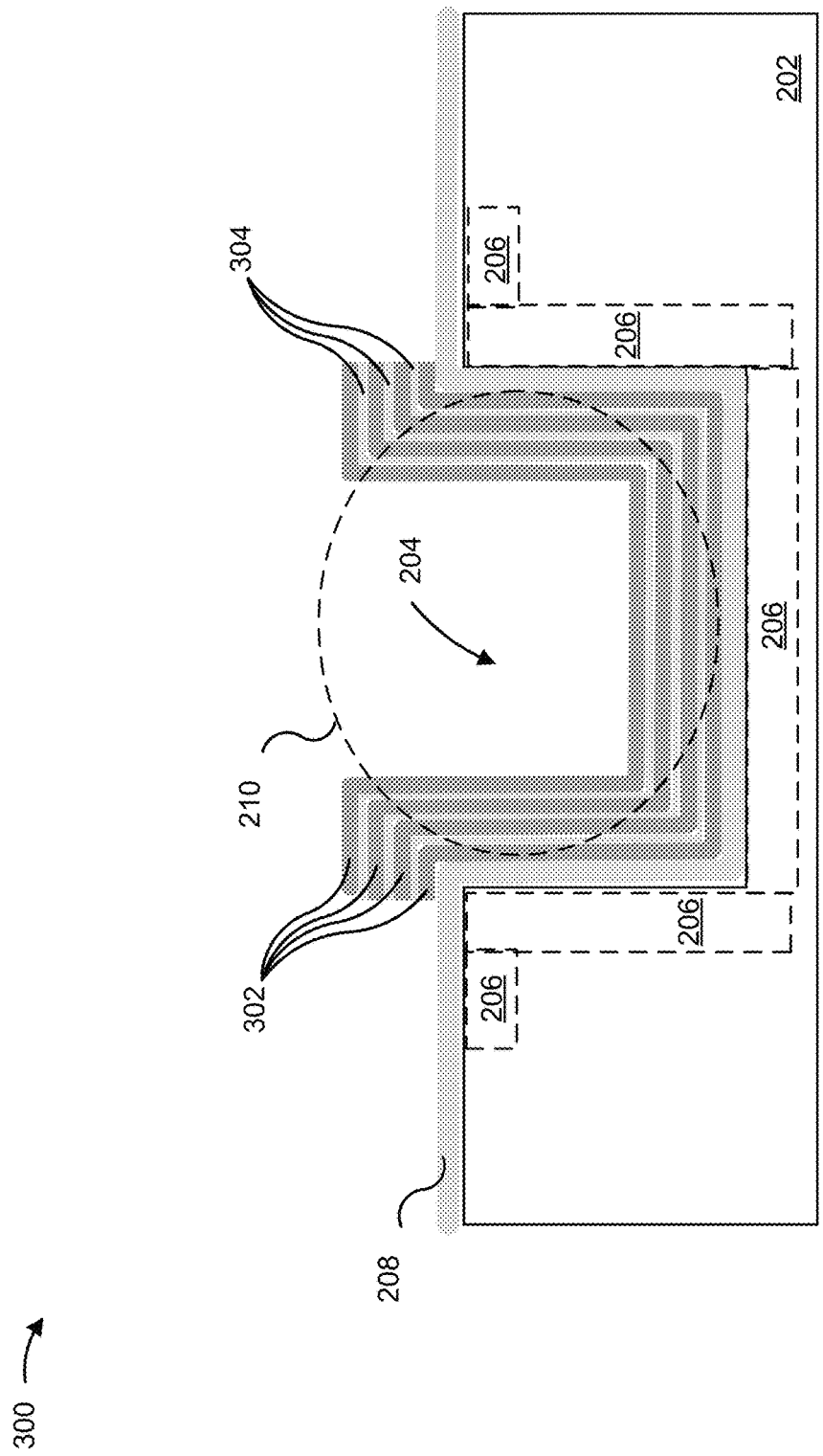

As shown in FIG. 3D, example implementation 300 may include forming a capacitor device 210 on the dielectric material 208, within the recessed portion 204 and/or on the upper surface of the substrate 202. In some implementations, a deposition tool (e.g., deposition tool 102) deposits layers of material of the capacitor device 210 on the dielectric material 208 (e.g., within the recessed portion 204 of the substrate 202 and/or on a top surface of the substrate 202). In some implementations, the deposition tool uses chemical vapor deposition or physical vapor deposition, among other examples, to deposit the layers of material of the capacitor device 210 on the dielectric material 208. In some implementations, the deposition tool may alternately deposit a layer of conductive material and a layer of non-conductive material to form a set of electrodes 302 and a set of dielectric layers 304. In some implementations, the set of electrodes 302 include a conductive material, such as titanium nitride-based material, tantalum nitride-based material, tantalum-based material, and/or titanium-based material, among other examples. In some implementations, the set of dielectric layers 304 include a high-k material, such as silicon monoxide-based material, zirconium oxide-based material, silicon oxide-based material, silicon nitride-based material, and/or aluminum oxide-based material, among other examples.

In some implementations, a planarization tool (e.g., planarization tool 106) may polish and/or planarize an upper surface of the capacitor device 210 after depositing one or more of layers of the set of electrodes 302 and/or one or more layers of the set of dielectric layers 304. In this way, the semiconductor structure 200 may have relatively planar layers of materials that have relatively uniform thicknesses (e.g., relatively uniform thicknesses of the set of electrodes 302 and/or relatively uniform thicknesses of the set of dielectric layers 304) based on polishing and/or planarizing the upper surface of the capacitor device 210.

Figure 3E:
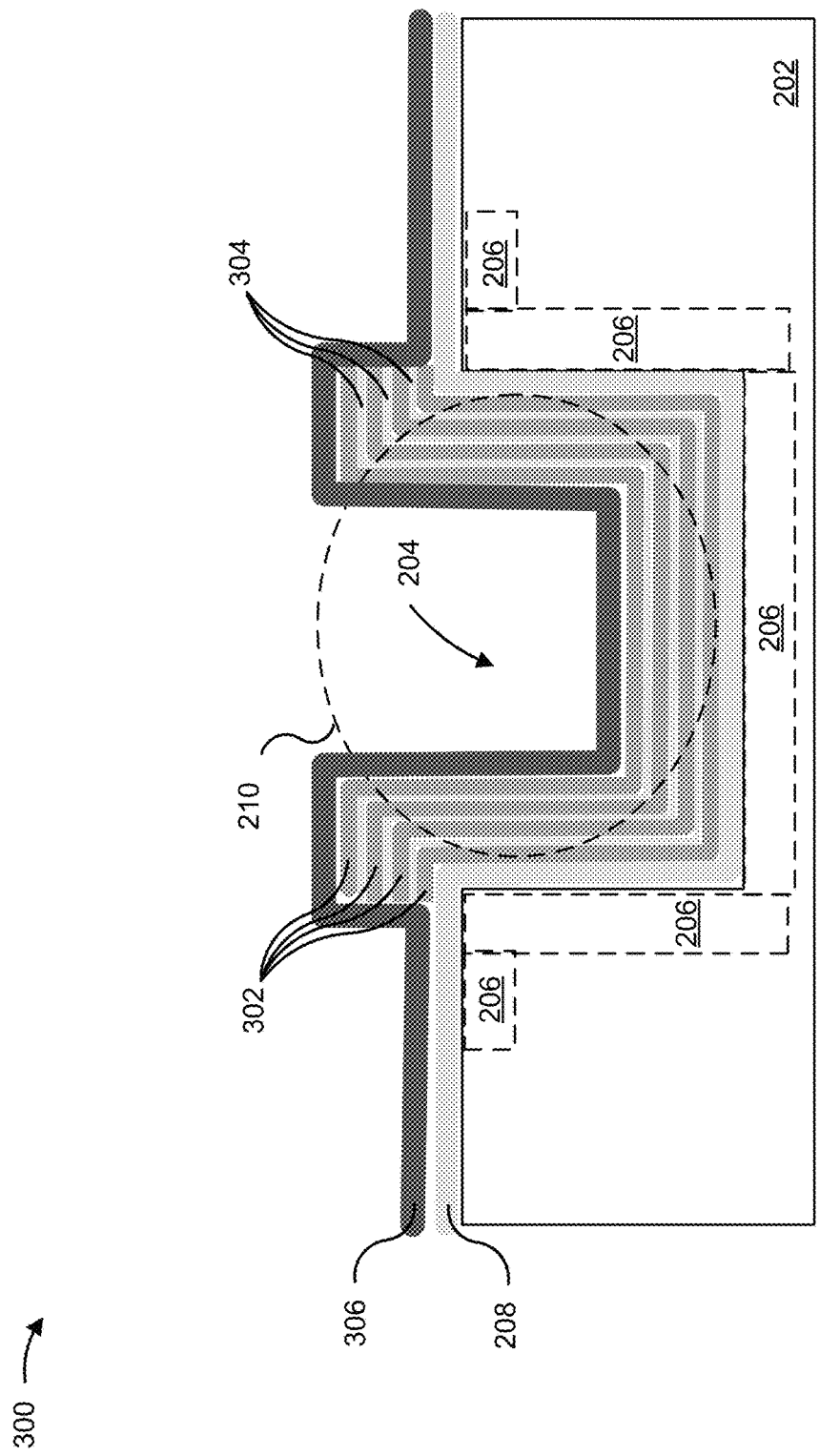

As shown in FIG. 3E, example implementation 300 may include forming a dielectric layer 306 on the upper surface of the capacitor device 210, on an outer surface of the capacitor device 210, and/or on an upper surface of the dielectric material 208. In some implementations, a deposition tool (e.g., deposition tool 102) deposits dielectric layer 306 on the upper surface of the capacitor device 210, on the outer surface of the capacitor device 210, and/or on the upper surface of the dielectric material 208. In some implementations, the deposition tool uses chemical vapor deposition or physical vapor deposition, among other examples, to deposit the dielectric layer 306 onto the upper surface of the capacitor device 210, onto the outer surface of the capacitor device 210, and/or onto the upper surface of the dielectric material 208. In some implementations, a planarization tool (e.g., planarization tool 106) may polish and/or planarize the upper surface of the dielectric layer 306 after depositing the dielectric layer 306.

Figure 3F:
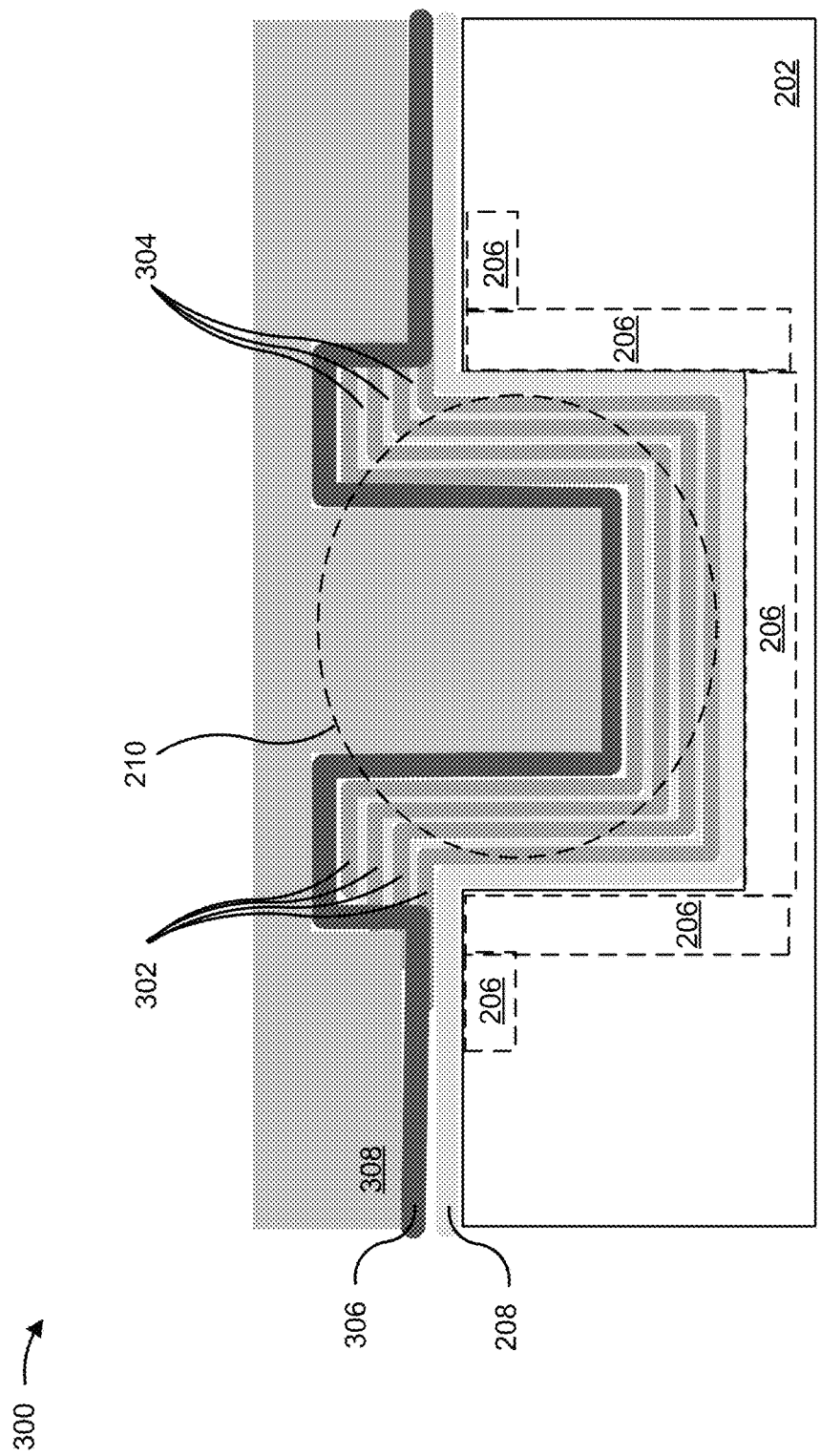

As shown in FIG. 3F, example implementation 300 may include forming a dielectric structure 308 on an upper surface of the dielectric layer 306. In some implementations, a deposition tool (e.g., deposition tool 102) deposits dielectric structure 308 on the upper surface of the dielectric layer 306. In some implementations, the deposition tool uses chemical vapor deposition or physical vapor deposition, among other examples, to deposit the dielectric structure 308 onto the upper surface of the dielectric layer 306. In some implementations, the dielectric structure 308 includes a low-k material, such as silicon dioxide, silicon nitride, or silicon oxynitride, among other examples.

In some implementations, a planarization tool (e.g., planarization tool 106) may polish and/or planarize an upper surface of the dielectric structure 308 after depositing the dielectric structure 308. In this way, the semiconductor structure 200 may have a generally planar upper surface after polishing and/or planarizing the upper surface of the dielectric material. This may allow for additional materials, layers, and/or structures, deposited on the dielectric structure 308, to be at generally a same height in the semiconductor structure 200. This may improve etching accuracy of subsequent etching processes.

Figure 3G:
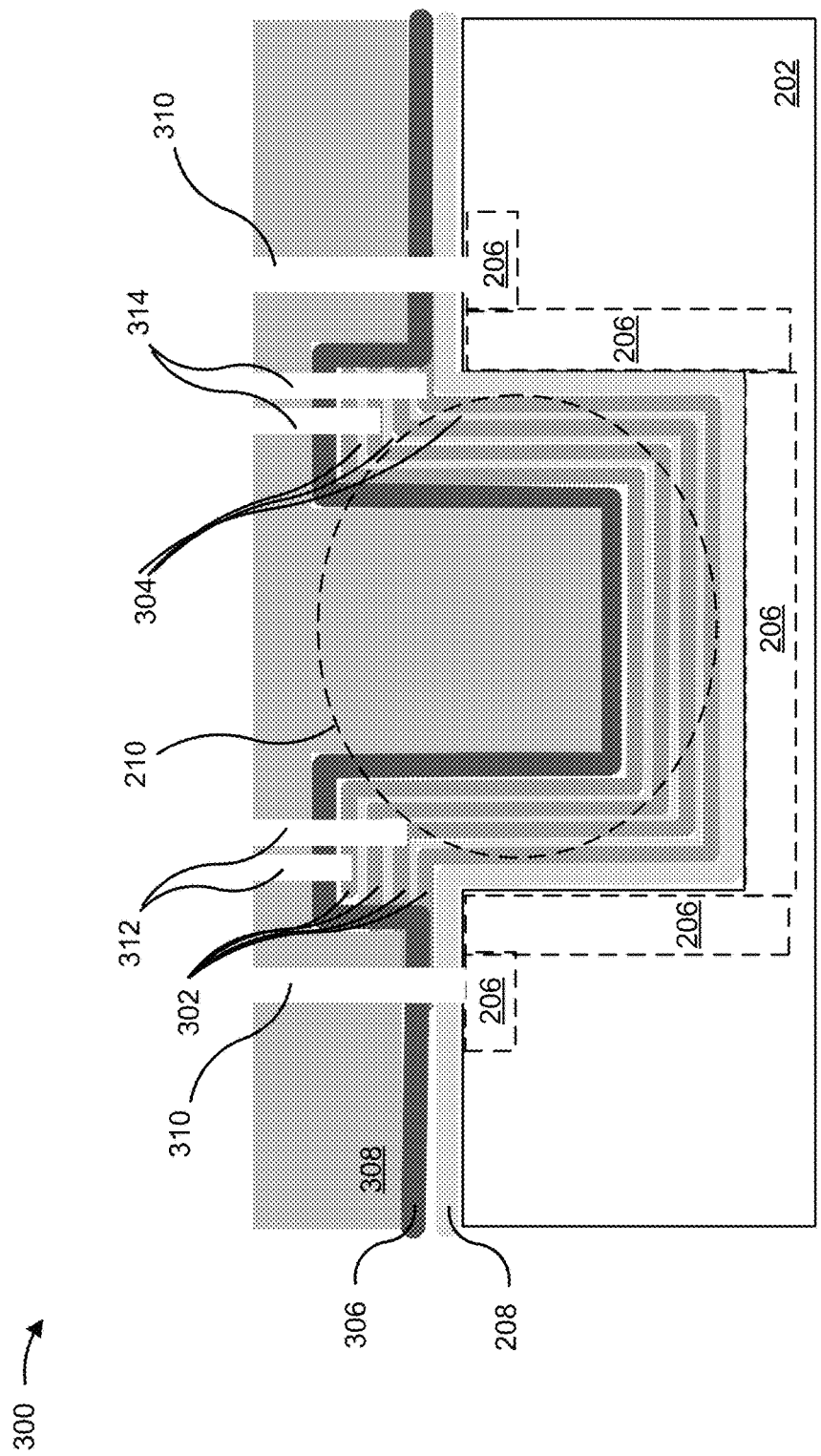

As shown in FIG. 3G, example implementation 300 may include forming one or more recesses 310, 312, and/or 314 in the dielectric structure 308, the dielectric layer 306, the dielectric material 208, and/or one or more portions of the capacitor device 210. In some implementations, an etching tool (e.g., etching tool 104) may remove one or more portions of the dielectric structure 308, the dielectric layer 306, the dielectric material 208, and/or one or more portions of the capacitor device 210 to form the one or more recesses 310, 312, and/or 314.

In some implementations, one or more recesses 310 may extend from a top surface of the dielectric structure 308 to a conductive portion 206 of the substrate 202. In some implementations, the conductive portion 206 includes, or may be connected to, another conductive portion 206 adjacent to at least a portion of the recessed portion 204 of the substrate 202 (e.g., partially surrounding or fully surrounding the recessed portion 204 of the substrate 202). In some implementations, the conductive portion 206 and/or the other conductive portion 206 may directly contact one or more of the sidewalls of the recessed portion 204.

In some implementations, one or more recesses 312 may extend from a top surface of the dielectric structure 308 to a first set of electrodes 302 of the capacitor device 210. In some implementations, the first set of electrodes 302 may be configured to have a same charge (e.g., positive or negative charge). In some implementations, one or more recesses 314 may extend from a top surface of the dielectric structure 308 to a second set of electrodes 302 of the capacitor device 210. In some implementations, the second set of electrodes 302 may be configured to have a same charge (e.g., negative or positive charge) and an opposite charge from the first set of electrodes 302.

In some implementations, one or more semiconductor processing tools may perform processes to etch the dielectric structure 308, the dielectric layer 306, the dielectric material 208, and/or one or more portions of the capacitor device 210 to form the one or more recesses 310, 312, and/or 314 using multiple steps. For example, a deposition tool (e.g., deposition tool 102) may deposit a photoresist on one or more portions of a top surface of the dielectric structure 308 before an etching tool (e.g., etching tool 104) performs an etching process to remove the portions of the dielectric structure 308, the dielectric layer 306, the dielectric material 208, and/or one or more portions of the capacitor device 210 that are not covered with the photoresist. In some implementations, the deposition tool and the etching tool may form recesses having a first depth in a first set of processes, may form recesses having a second depth in a second set of processes, and/or may form recesses having a third depth in a third set of processes, among other examples. In other words, recesses having different depths may be formed separately and/or with additional or fewer processes.

Figure 3H:
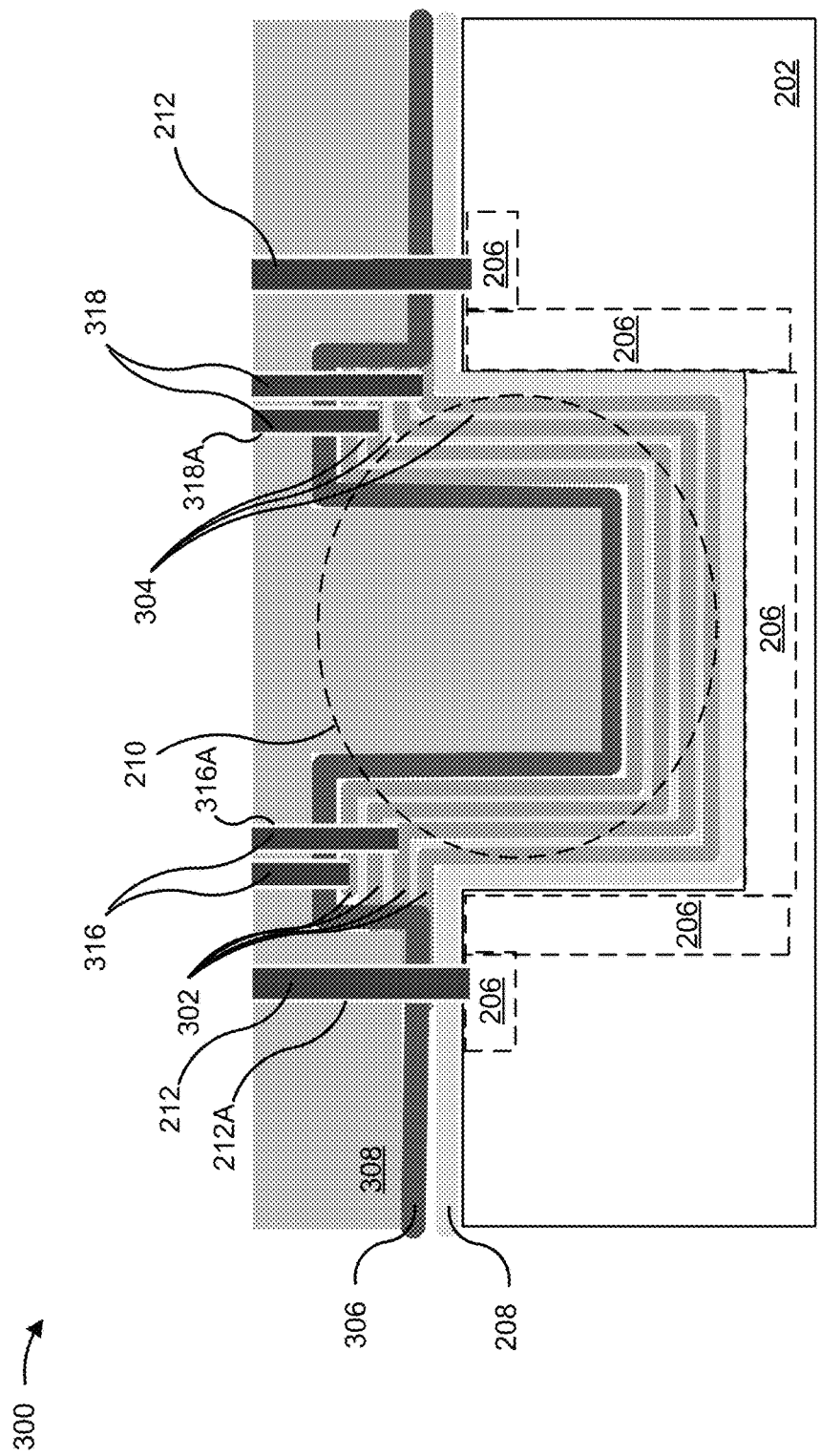

As shown in FIG. 3H, example implementation 300 may include forming one or more conductive structures 212, 316, and/or 318 within the one or more recesses 310, 312, and/or 314. In some implementations, a deposition tool (e.g., deposition tool 102) deposits one or more conductive structures 212, 316, and/or 318 within the one or more recesses 310, 312, and/or 314. In some implementations, the deposition tool uses chemical vapor deposition or physical vapor deposition, among other examples, to deposit the one or more conductive structures 212, 316, and/or 318 into the one or more recesses 310, 312, and/or 314.

In some implementations, the deposition tool may perform one or more deposition operations to deposit the conductive structures 212, 316, and/or 318. For example, the deposition tool may deposit an insulating layer 212A, 316A, and/or 318A (e.g., a dielectric layer) on sidewalls of the one or more recesses 310, 312, and/or 314 to prevent a short between the conductive structures 212, 316, and/or 318 and one or more additional conductive structures of the semiconductor structure 200 (e.g., layers of the set of electrodes 302) positioned on sidewalls of the one or more recesses 310, 312, and/or 314. In some implementations, an etching tool (e.g., etching tool 104) may etch a portion of the insulating layer from a bottom surface of the one or more recesses 310, 312, and/or 314 to expose metal materials at bottoms of the one or more recesses 310, 312, and/or 314. The deposition tool may deposit one or more conductive materials (e.g., a barrier layer, a liner, and/or a metal fill material) into the one or more recesses 310, 312, and/or 314 and in contact with the metal material at the bottoms of the one or more recesses 310, 312, and/or 314. In some implementations, a planarization tool (e.g., planarization tool 106) may polish and/or planarize an upper surface of the one or more conductive structures 212, 316, and/or 318 after depositing the one or more conductive structures 212, 316, and/or 318.

In some implementations, depositing the one or more conductive structures 212, 316, and/or 318 includes depositing the one or more conductive structures 212, 316, and/or 318 in multiple processes. For example, the multiple processes include depositing a dielectric layer on sidewalls of the one or more recesses 310, 312, and/or 314. In this way, the one or more conductive structures 212, 316, and/or 318 may be electrically insulated from one or more materials through which the one or more recesses 310, 312, and/or 314 extends (e.g., one or more of the sets of electrodes 302/304). The multiple processes may also include depositing one or more liners (e.g., adhesions layers) or barriers (e.g., titanium nitride-based material, tantalum nitride-based material, tantalum-based material, and/or titanium-based material, among other examples). The multiple processes may further include depositing a conductive material, such as a tungsten-based material, a ruthenium-based material, a copper-based material, and/or a cobalt-based material, among other examples, to fill the one or more conductive structures 212, 316, and/or 318.

Figure 3I:
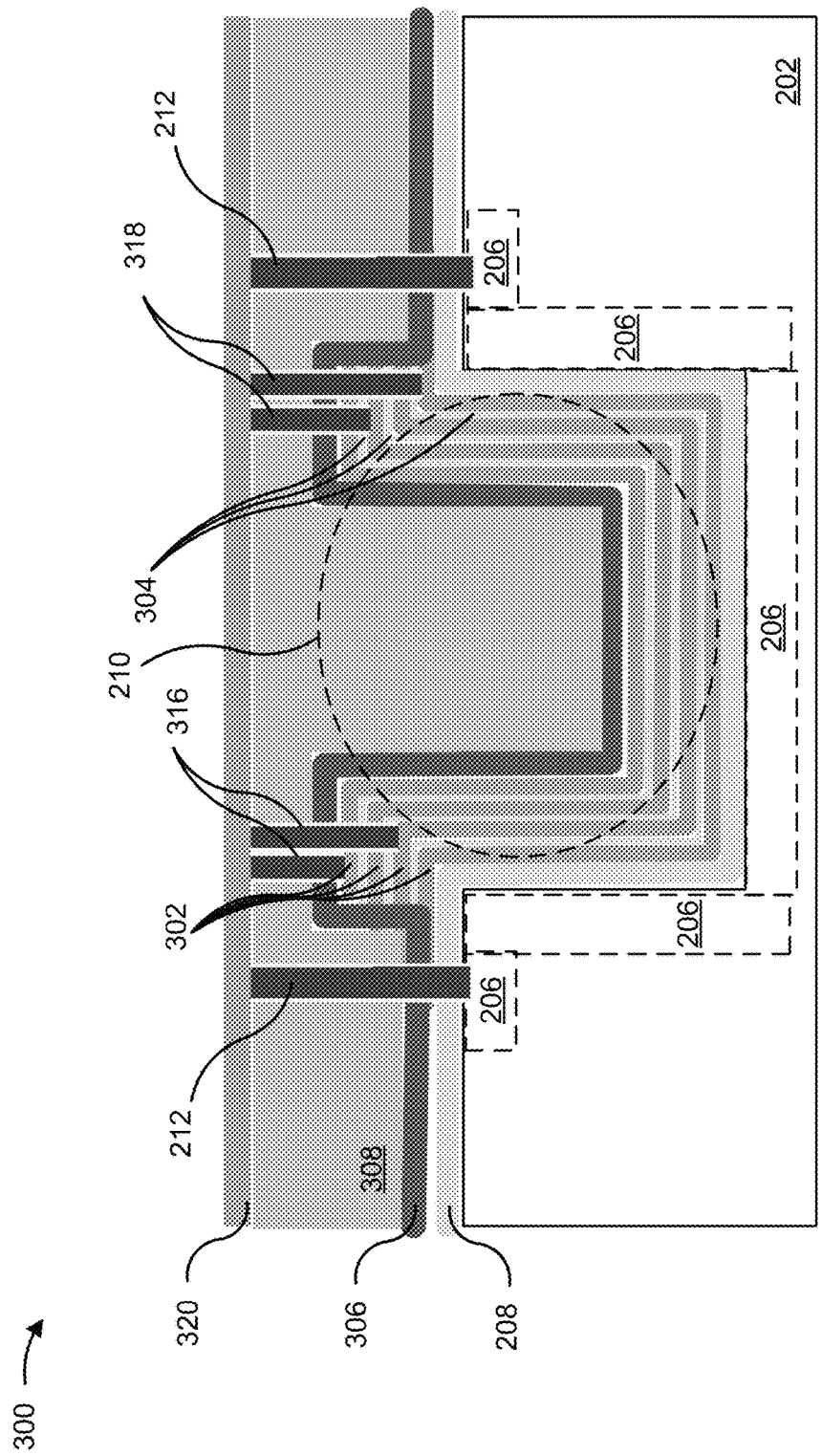

As shown in FIG. 3I, example implementation 300 may include forming a dielectric layer 320 on an upper surface of the dielectric structure 308 and on an upper surface of the one or more conductive structures 212, 316, and/or 318. In some implementations, a deposition tool (e.g., deposition tool 102) uses chemical vapor deposition or physical vapor deposition, among other examples, to deposit the dielectric layer 320 onto the upper surface of the dielectric structure 308 and on an upper surface of the one or more conductive structures 212, 316, and/or 318. In some implementations, the dielectric layer 320 includes a low-k material, such as silicon nitrate or silicon carbide, among other examples. In some implementations, a planarization tool (e.g., planarization tool 106) may polish and/or planarize an upper surface of the dielectric layer 320 after depositing the dielectric layer 320. This may allow for any additional materials, layers, and/or structures, deposited on the dielectric layer 320 to be at generally a same height in the semiconductor structure 200. This may improve etching accuracy of subsequent etching processes.

Figure 3J:
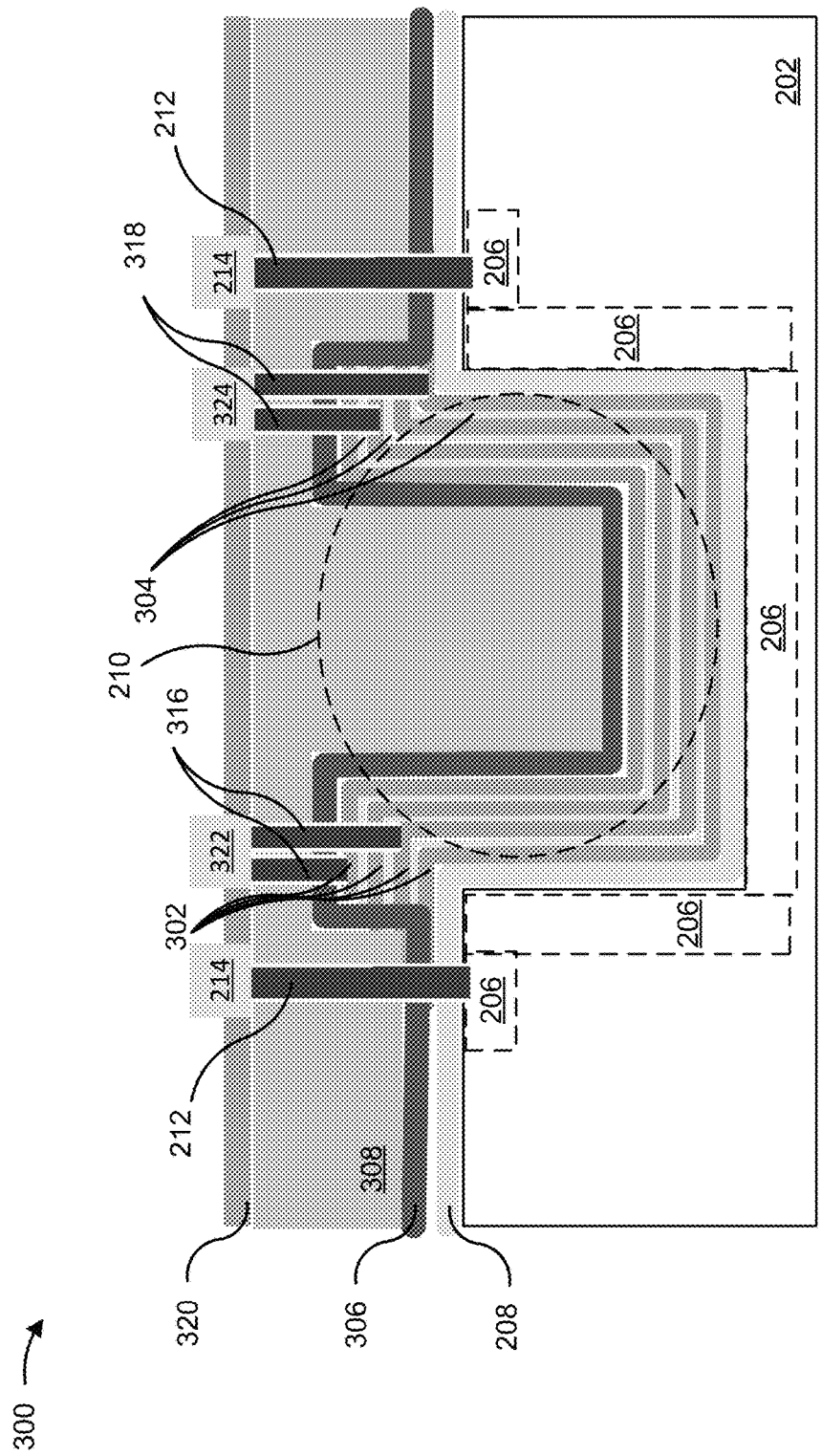

As shown in FIG. 3J, example implementation 300 may include forming one or more voltage source/drains 214, 322, and/or 324 on the one or more conductive structures 212, 316, and/or 318. In some implementations, a deposition tool (e.g., deposition tool 102) deposits one or more voltage source/drains 214, 322, and/or 324 onto the one or more conductive structures 212, 316, and/or 318. In some implementations, the deposition tool uses chemical vapor deposition or physical vapor deposition, among other examples, to deposit the one or more voltage source/drains 214, 322, and/or 324 onto the one or more conductive structures 212, 316, and/or 318. In some implementations, an etching tool (e.g., etching tool 104) may etch portions of the dielectric layer 320 to provide access to (e.g., to expose) the one or more conductive structures 212, 316, and/or 318 before depositing the one or more voltage source/drains 214, 322, and/or 324 onto the one or more conductive structures 212, 316, and/or 318. In some implementations, a planarization tool (e.g., planarization tool 106) may polish and/or planarize an upper surface of the one or more voltage source/drains 214, 322, and/or 324 after depositing the one or more voltage source/drains 214, 322, and/or 324.

As indicated above, FIGS. 3A-3J are provided as an example. Other examples may differ from what is described with regard to FIGS. 3A-3J. The number and arrangement of devices, layers, and/or materials shown in FIGS. 3A-3J are provided as an example. In practice, there may be additional devices, layers, and/or materials, fewer devices, layers, and/or materials, different devices, layers, and/or materials, or differently arranged devices, layers, and/or materials than those shown in FIGS. 3A-3J.

Figure 4A:
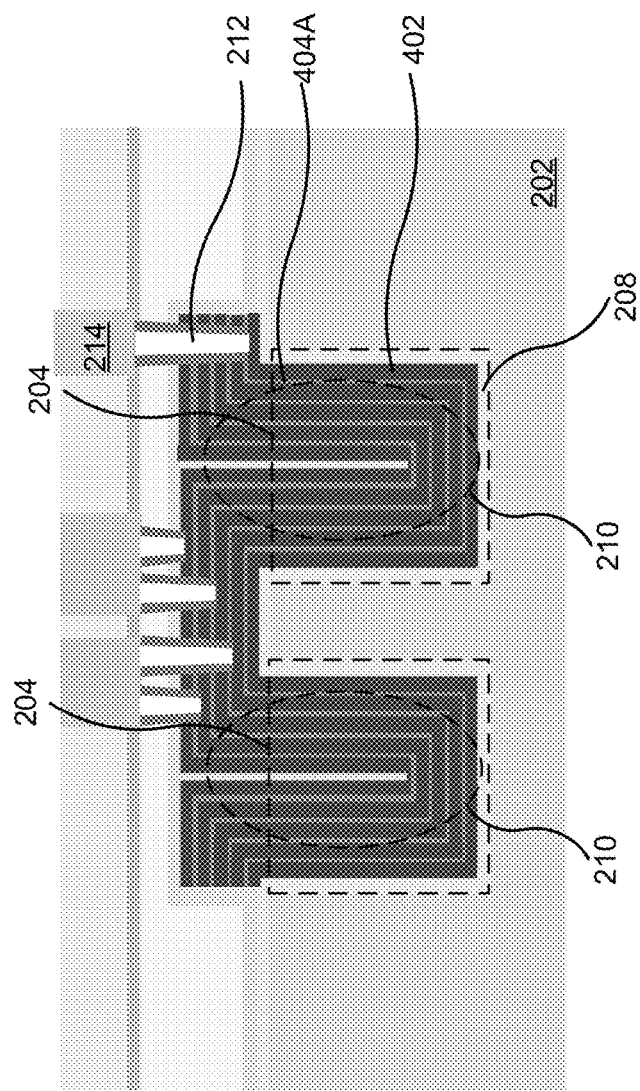
FIGS. 4A and 4B are diagrams of example semiconductor structures described herein.
Figure 4B:
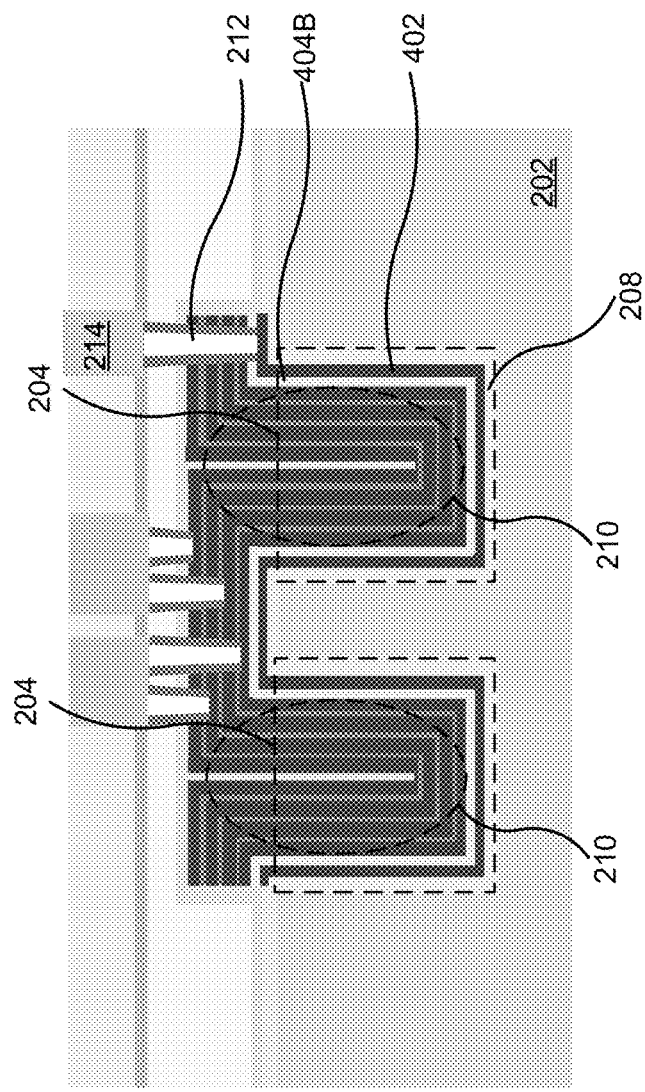

FIGS. 4A and 4B are diagrams of example semiconductor structures 400A and 400B described herein. In some implementations, the semiconductor structures 400A and 400B includes one or more layers not shown in FIGS. 4A and 4B, such as one or more barrier layers, adhesion layers, metal gates, substrates, interconnects, recesses (e.g., vias), or semiconductor structures, among other examples. In some implementations, the semiconductor structures 400A and 400B include one or more materials, structures, and/or layers as described herein in connection with FIGS. 2-3J.

As shown in FIG. 4A, a semiconductor structure 400A may include a substrate 202 having one or more recessed portions 204. The semiconductor structure 400A may include a dielectric material 208 disposed within the one or more recessed portions 204. In some implementations, the dielectric material 208 includes a low-k material, such as silicon dioxide, silicon nitride, or silicon oxynitride, among other examples. The dielectric material 208 may form a liner within the one or more recessed portions 204 and/or may extend onto the top surface of the substrate 202. In some implementations, the dielectric material 208 may provide electrical insulation between the substrate 202 and structures, layers, and/or materials disposed above the dielectric material 208 (e.g., a conductive structure 402).

The semiconductor structure 400A may include a conductive structure 402 disposed within the one or more recessed portions 204 of the substrate 202 of the semiconductor structure 400A. In some implementations, the conductive structure 402 includes a metal-based material, such as titanium nitride-based material, tantalum nitride-based material, tantalum-based material, and/or titanium-based material, among other examples. The conductive structure 402 may have a relatively high conductivity (e.g., greater than doped silicon). In some implementations, the conductive structure 402 may extend along one or more of sidewalls of the one or more recessed portions 204 and/or along the bottom surface of the one or more recessed portions 204. In some implementations, the conductive structure 402 may extend onto a portion of the dielectric material 208 disposed on the top surface of the substrate 202. The dielectric material 208 may be disposed between the conductive structure 402 and the substrate 202 and/or may provide electrical insulation between the conductive structure 402 and the substrate 202.

The semiconductor structure 400A may include a dielectric material 404A disposed on the conductive structure 402. In some implementations, the dielectric material 404A includes a high-k dielectric material, such as silicon monoxide-based material, zirconium oxide-based material, silicon oxide-based material, silicon nitride-based material, and/or aluminum oxide-based material, among other examples. In some implementations, the high-k material may have a k-value that is higher than a k-value of the dielectric material 208.

As shown in FIG. 4A, the semiconductor structure 400A may include a conductive structure 212 coupled to the conductive structure 402. The conductive structure 212 may provide an electrical connection from the conductive structure 402 to a voltage source/drain 214. In some implementations, a voltage of the voltage source 214 is based on a voltage applied to a bottom electrode of the capacitor device 210. For example, the voltage of the voltage source/drain 214 may be configured to be a negative voltage based on the bottom electrode of the capacitor device 210 being configured to receive a positive voltage. Alternatively, the voltage of the voltage source/drain 214 may be configured to be a positive voltage based on the bottom electrode of the capacitor device 210 being configured to receive a negative voltage.

Based on disposing the conductive structure 402 between the capacitor device 210 and the substrate 202, the semiconductor structure 200 may collect and/or drain charge, with improved efficiency, to reduce a charge accumulation within the substrate 202. For example, based on a conductivity of the conductive structure 402 being greater than a doped substrate material, the conductive structure 402 may collect and/or drain charge, that might otherwise cause parasitic capacitance, with improved efficiency and/or efficacy when compared with a semiconductor structure that does not have such a conductive structure, or that uses a conductive structure with a low conductivity.

As shown in FIG. 4B, a semiconductor structure 400B may include a substrate 202 having one or more recessed portions 204. The semiconductor structure 400B may include a dielectric material 208 disposed within the one or more recessed portions 204. In some implementations, the dielectric material 208 includes a low-k material, such as silicon dioxide, silicon nitride, or silicon oxynitride, among other examples. The dielectric material 208 may form a liner within the one or more recessed portions 204 and/or may extend onto the top surface of the substrate 202. In some implementations, the dielectric material 208 may provide electrical insulation between the substrate 202 and structures, layers, and/or materials disposed above the dielectric material 208 (e.g., a conductive structure 402).

The semiconductor structure 400B may include a conductive structure 402 disposed within the one or more recessed portions 204 of the substrate 202 of the semiconductor structure 400B. In some implementations, the conductive structure 402 includes a metal-based material, such as titanium nitride-based material, tantalum nitride-based material, tantalum-based material, and/or titanium-based material, among other examples. The conductive structure 402 may have a relatively high conductivity (e.g., greater than doped silicon). In some implementations, the conductive structure 402 may extend along one or more of sidewalls of the one or more recessed portions 204 and/or along the bottom surface of the one or more recessed portions 204. In some implementations, the conductive structure 402 may extend onto a portion of the dielectric material 208 disposed on the top surface of the substrate 202. The dielectric material 208 may be disposed between the conductive structure 402 and the substrate 202 and/or may provide electrical insulation between the conductive structure 402 and the substrate 202.

The semiconductor structure 400B may include a dielectric material 404B disposed on the conductive structure 402. In some implementations, the dielectric material 404B includes a low-k material, such as silicon dioxide, silicon nitride, or silicon oxynitride, among other examples. In some implementations, the low-k material may have a k-value that is lower than a k-value of dielectric material used between electrodes of the capacitor device 210.

As shown in FIG. 4B, the semiconductor structure 400B may include a conductive structure 212 coupled to the conductive structure 402. The conductive structure 212 may provide an electrical connection from the conductive structure 402 to a voltage source/drain 214. In some implementations, a voltage of the voltage source 214 is based on a voltage applied to a bottom electrode of the capacitor device 210. For example, the voltage of the voltage source/drain 214 may be configured to be a negative voltage based on the bottom electrode of the capacitor device 210 being configured to receive a positive voltage. Alternatively, the voltage of the voltage source/drain 214 may be configured to be a positive voltage based on the bottom electrode of the capacitor device 210 being configured to receive a negative voltage.

Based on disposing the conductive structure 402 between the capacitor device 210 and the substrate 202, and disposing a low-k dielectric material (e.g., dielectric material 404B) between the conductive structure 402 and the capacitor device 210 an amount of parasitic capacitance may be reduced. For example, the low-k dielectric material may reduce a potential electric field produced by the bottom electrode of the capacitor device in a direction of the conductive structure 402 and the conductive structure 402 may collect and/or drain charge that might otherwise cause parasitic capacitance with improved efficiency and/or efficacy when compared with a semiconductor structure that does not have a conductive structure, or that uses a conductive structure with a low conductivity.

As indicated above, FIGS. 4A and 4B are provided as examples. Other examples may differ from what is described with regard to FIGS. 4A and 4B. The number and arrangement of devices, layers, and/or materials shown in FIGS. 4A and 4B are provided as examples. In practice, there may be additional devices, layers, and/or materials, fewer devices, layers, and/or materials, different devices, layers, and/or materials, or differently arranged devices, layers, and/or materials than those shown in FIGS. 4A and 4B.

FIGS. 5A-5F are diagrams of an example implementation 500 described herein. Example implementation 500 may be an example process for forming a semiconductor structure 400 (e.g., semiconductor structure 400A or 400B). FIGS. 5A-5F show a semiconductor structure 400 having a capacitor device 210 disposed within a single recessed portion 204 of a substrate 202. However, the semiconductor structure 400 may have a capacitor device 210 disposed within multiple recessed portions 204 of the substrate 202 and/or on a top surface of the substrate 202 between the multiple recessed portions 204 (e.g., as shown in FIG. 2). The implementation 500 may be applied to forming a semiconductor device 400 having a single recessed portion 204 or multiple recessed portions 204. The semiconductor structure 400 may include one or more additional devices, structures, and/or layers not shown in FIGS. 5A-5F.

Figure 5A:
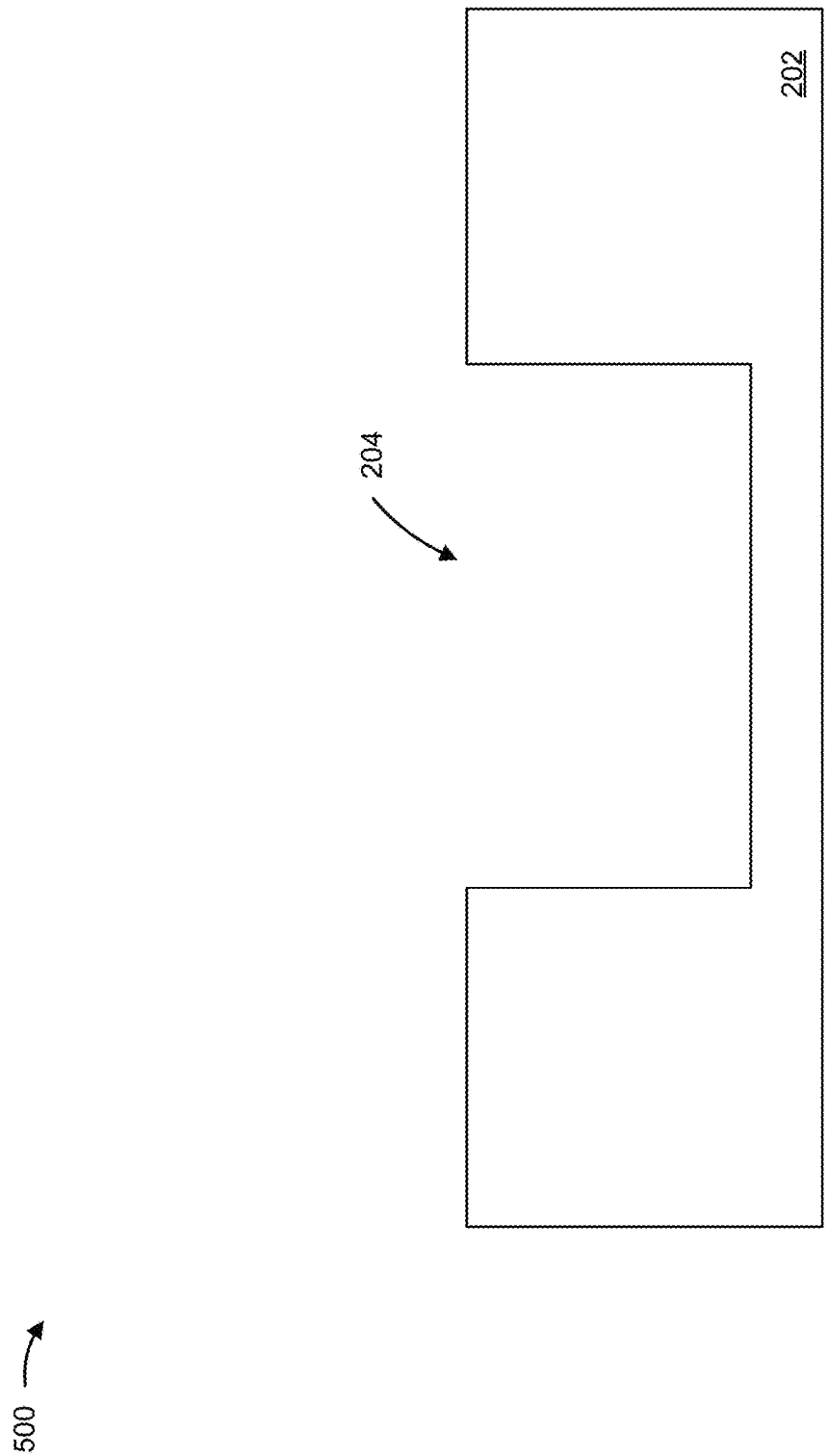
FIGS. 5A-5F are diagrams of an example implementation described herein.

As shown in FIG. 5A, example implementation 500 may include forming a substrate 202 having a recessed portion 204. In some implementations, a deposition tool (e.g., deposition tool 102) deposits substrate 202 on a lower layer of the semiconductor structure 200. In some implementations, the deposition tool uses chemical vapor deposition or physical vapor deposition, among other examples, to deposit the substrate 202 onto the lower layer of the semiconductor structure 200. In some implementations, another semiconductor processing tool may form and/or cut the substrate 202 in preparation for forming the semiconductor structure 200.

In some implementations, an etching tool (e.g., etching tool 104) may remove a portion of the substrate 202 to form the recessed portion 204. In some implementations, one or more semiconductor processing tools may perform processes to etch the portion of the substrate 202 using multiple steps. For example, the deposition tool may deposit a photoresist on one or more portions of a top surface of the substrate 202 before an etching tool performs an etching process to remove the portion of the substrate 202 that is not covered with the photoresist.

Figure 5B:
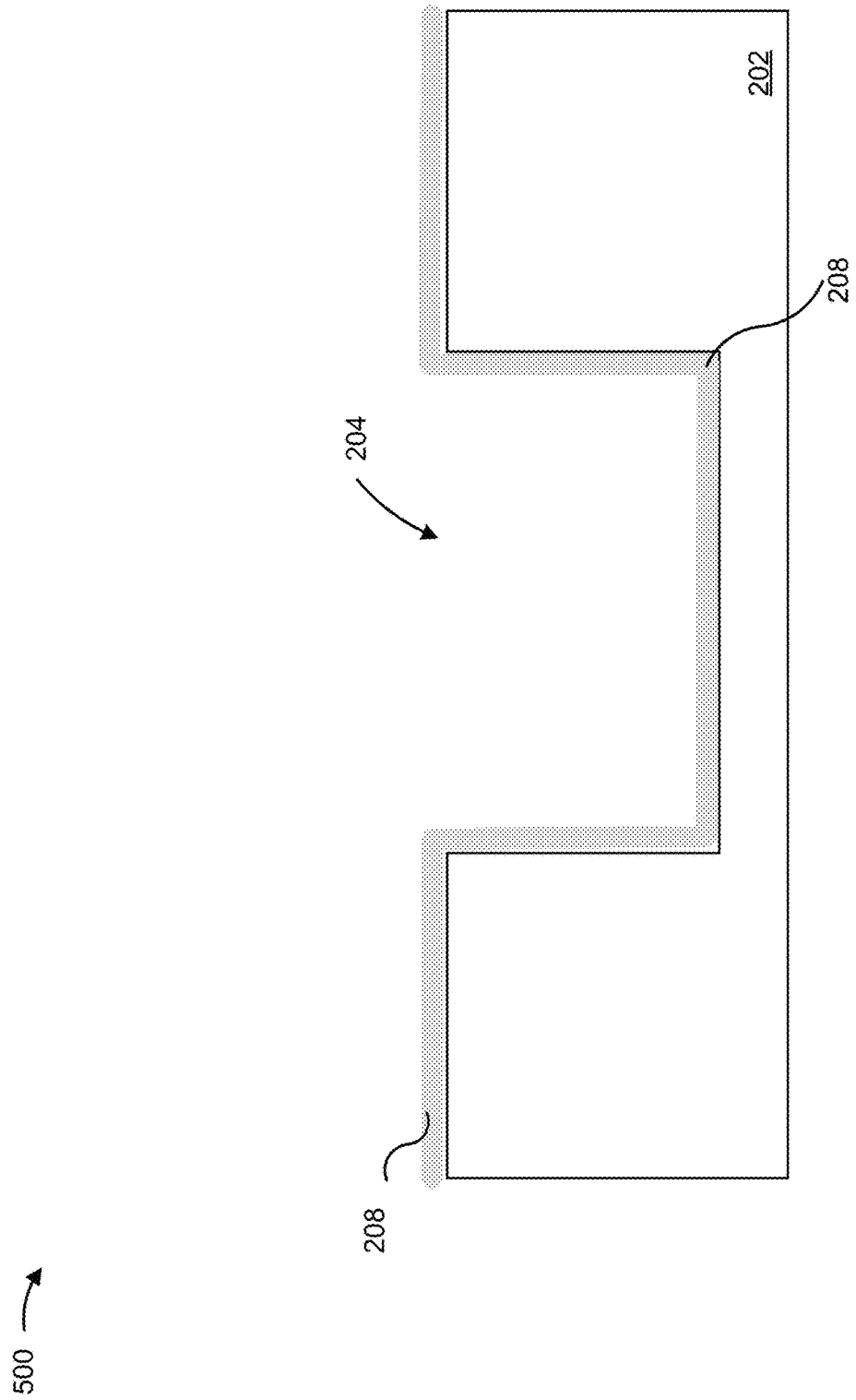

As shown in FIG. 5B, example implementation 500 may include forming a dielectric material 208 within the recessed portion 204 and/or on a top surface of the substrate 202. In some implementations, a deposition tool (e.g., deposition tool 102) deposits dielectric material 208 on the substrate 202 of the semiconductor structure 200. In some implementations, the deposition tool uses chemical vapor deposition or physical vapor deposition, among other examples, to deposit the dielectric material 208 within the recessed portion 204 and/or onto a top surface of the substrate 202. In some implementations, a planarization tool (e.g., planarization tool 106) may polish and/or planarize an upper surface of the dielectric material 208 after depositing the dielectric material 208.

Figure 5C:
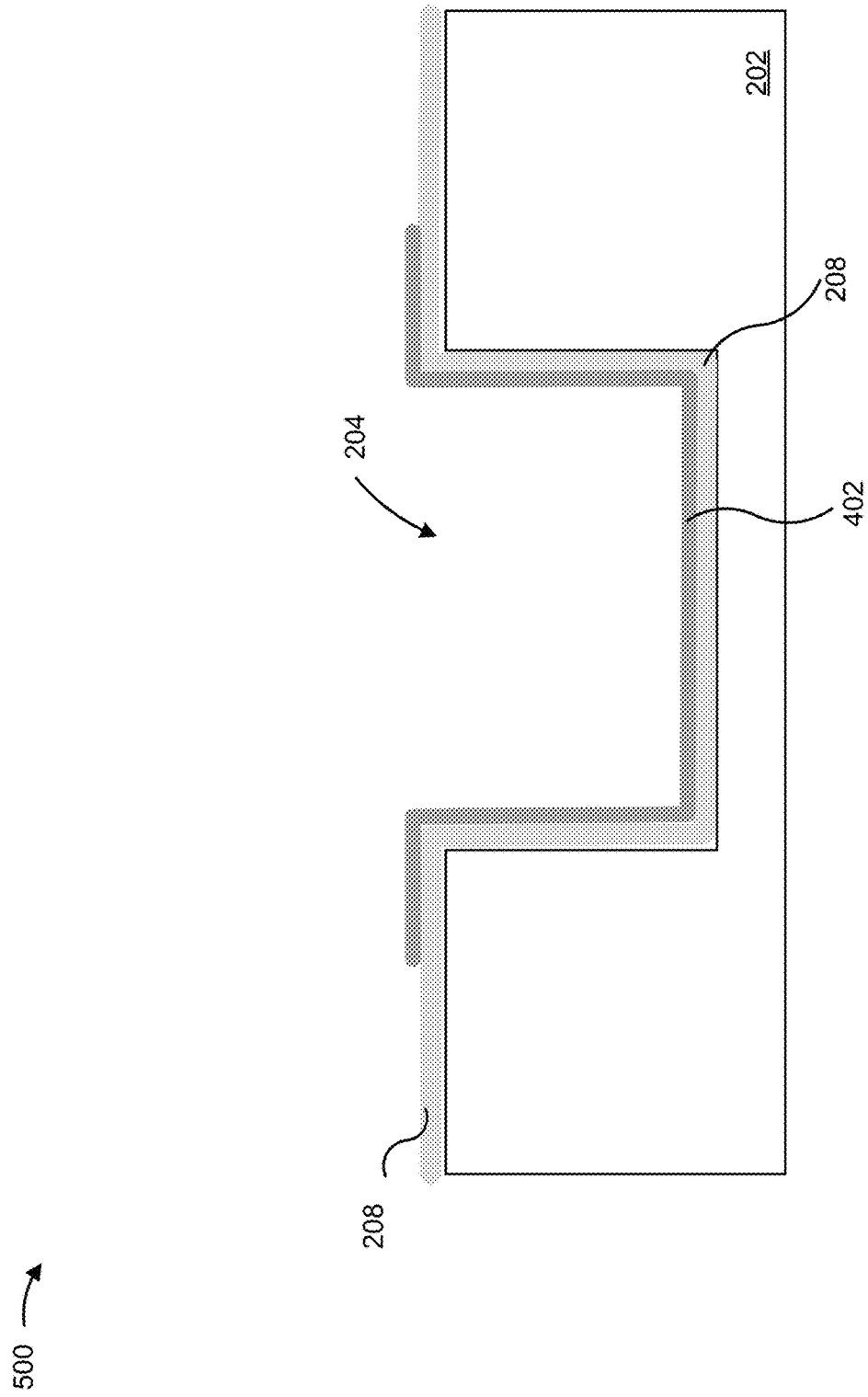

As shown in FIG. 5C, example implementation 500 may include forming a conductive structure 402 on the dielectric material 208, within the recessed portion 204 of the substrate 202, and/or on the top surface of the substrate 202. In some implementations, a deposition tool (e.g., deposition tool 102) deposits conductive structure 402 onto the dielectric material 208, within the recessed portion 204 of the substrate 202, and/or on the top surface of the substrate 202. In some implementations, the deposition tool uses chemical vapor deposition or physical vapor deposition, among other examples, to deposit the conductive structure 402 onto the dielectric material 208, within the recessed portion 204 of the substrate 202, and/or on a top surface of the substrate 202. In some implementations, a planarization tool (e.g., planarization tool 106) may polish and/or planarize an upper surface of the conductive structure 402 after depositing the conductive structure 402.

Figure 5D:
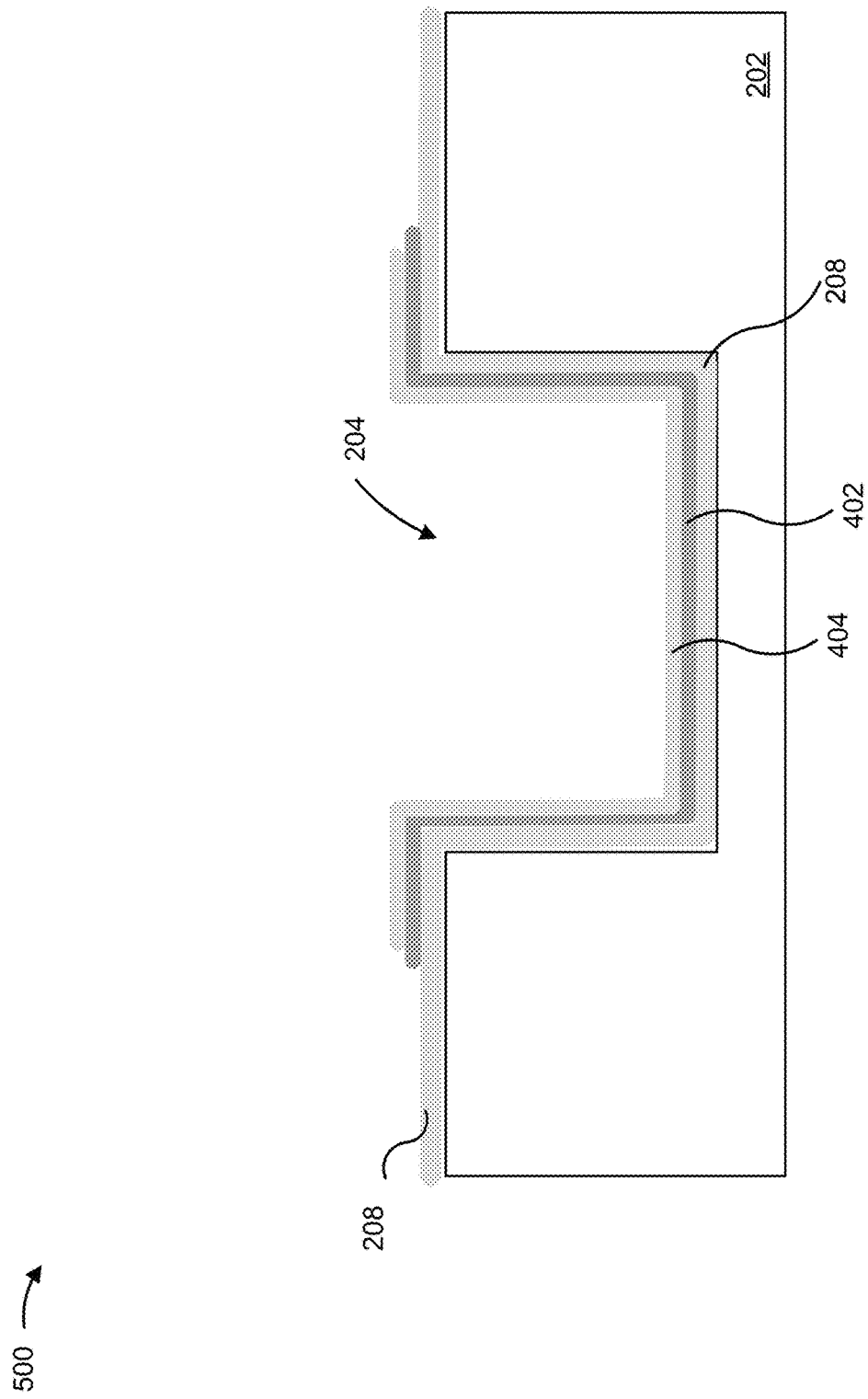

As shown in FIG. 5D, example implementation 500 may include forming a dielectric material 404 within the one or more recessed portions 204 and/or on the conductive structure 402. In some implementations, a deposition tool (e.g., deposition tool 102) deposits dielectric material 404 within the one or more recessed portions 204 and/or onto the conductive structure 402. In some implementations, the deposition tool uses chemical vapor deposition or physical vapor deposition, among other examples, to deposit the dielectric material 404 within the recessed portion 204 and/or onto the conductive structure 402. In some implementations, the dielectric material 404 includes a high-k dielectric material (e.g., dielectric material 404A). In some implementations, the dielectric material 404 includes a low-k dielectric material (e.g., dielectric material 404B). In some implementations, a planarization tool (e.g., planarization tool 106) may polish and/or planarize an upper surface of the dielectric material 404 after depositing the dielectric material 404.

Figure 5E:
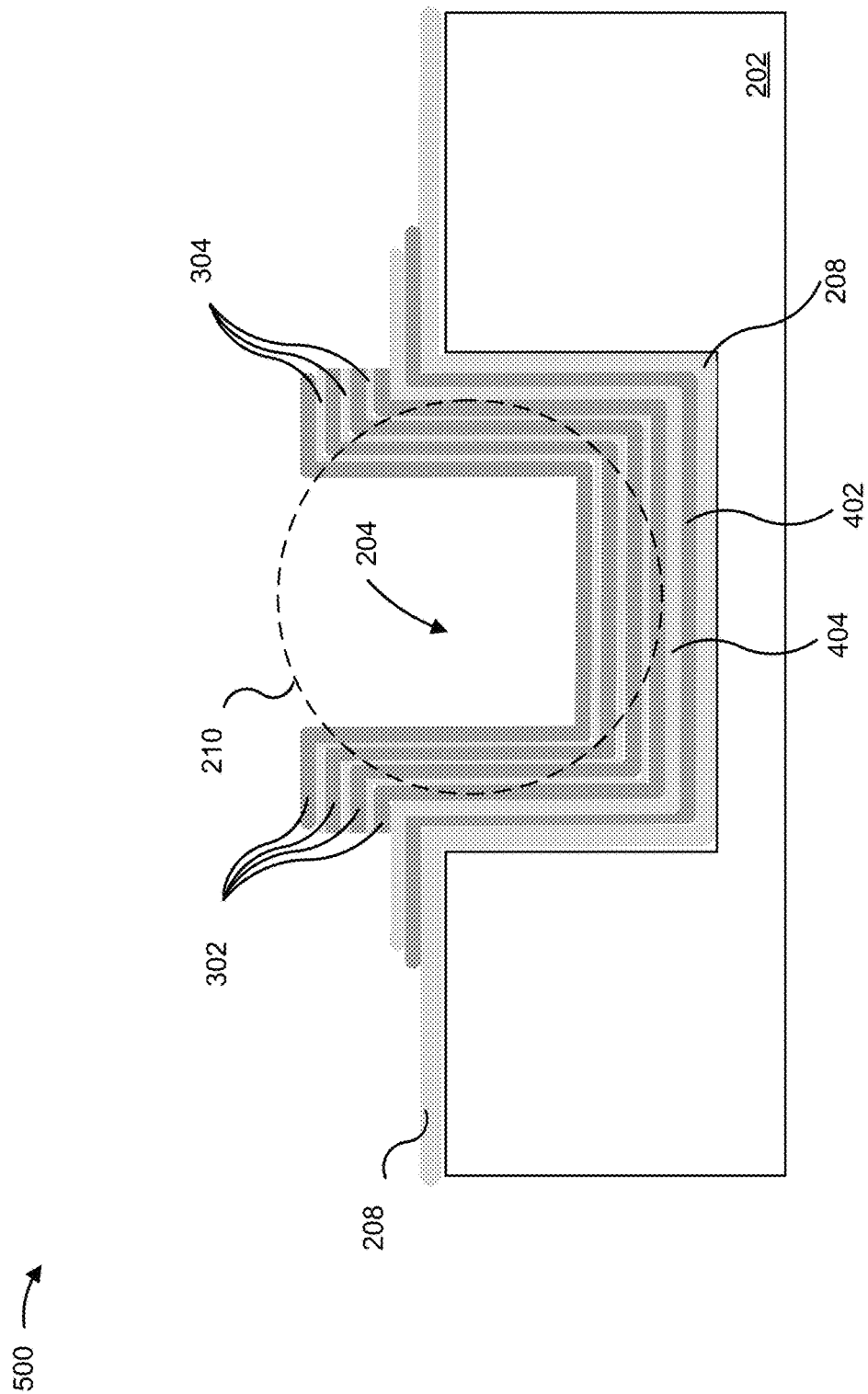

As shown in FIG. 5E, example implementation 500 may include forming a capacitor device 210 on the dielectric material 404, within the recessed portion 204 and/or on the top surface of the substrate 202. In some implementations, a deposition tool (e.g., deposition tool 102) deposits layers of material of the capacitor device 210 on the dielectric material 404 (e.g., within the recessed portion 204 of the substrate 202 and/or on the top surface of the substrate 202). In some implementations, the deposition tool uses chemical vapor deposition or physical vapor deposition, among other examples, to deposit the layers of material of the capacitor device 210 on the dielectric material 404. In some implementations, the deposition tool may alternately deposit a layer of conductive material and a layer of non-conductive material to form a set of electrodes 302 and a set of dielectric layers 304. In some implementations, the set of electrodes 302 include a conductive material, such as titanium nitride-based material, tantalum nitride-based material, tantalum-based material, and/or titanium-based material, among other examples. In some implementations, the set of dielectric layers 304 include a high-k material, such as silicon monoxide-based material, zirconium oxide-based material, silicon oxide-based material, silicon nitride-based material, and/or aluminum oxide-based material, among other examples.

In some implementations, a planarization tool (e.g., planarization tool 106) may polish and/or planarize an upper surface of the capacitor device 210 after depositing one or more of layers of the set of electrodes 302 and/or one or more layers of the set of dielectric layers 304. In this way, the semiconductor structure 200 may have relatively planar layers of materials that have relatively uniform thicknesses (e.g., relatively uniform thicknesses of the set of electrodes 302 and/or relatively uniform thicknesses of the set of dielectric layers 304).

Figure 5F:
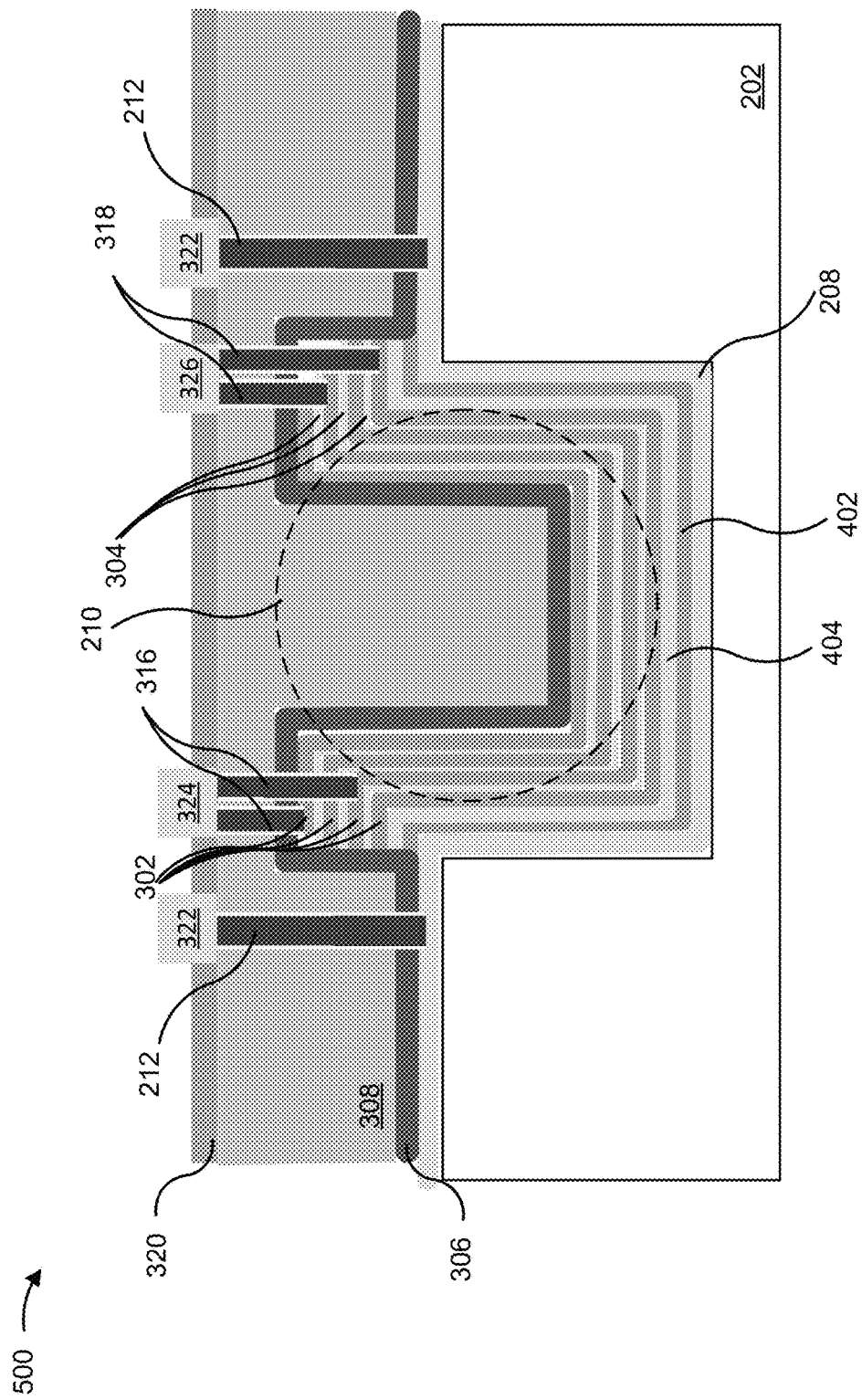

As shown in FIG. 5F, example implementation 500 may include forming one or more additional structures, layers, and/or materials of the semiconductor structure 400. In some implementations, one or more semiconductor processing tools may perform the same or similar processes as shown in FIGS. 3E-3J, after performing the processes shown in FIGS. 4A-4E, to form the semiconductor structure shown in FIG. 5F.

As indicated above, FIGS. 5A-5F are provided as an example. Other examples may differ from what is described with regard to FIGS. 5A-5F. The number and arrangement of devices, layers, and/or materials shown in FIGS. 5A-5F are provided as an example. In practice, there may be additional devices, layers, and/or materials, fewer devices, layers, and/or materials, different devices, layers, and/or materials, or differently arranged devices, layers, and/or materials than those shown in FIGS. 5A-5F.

Figure 6:
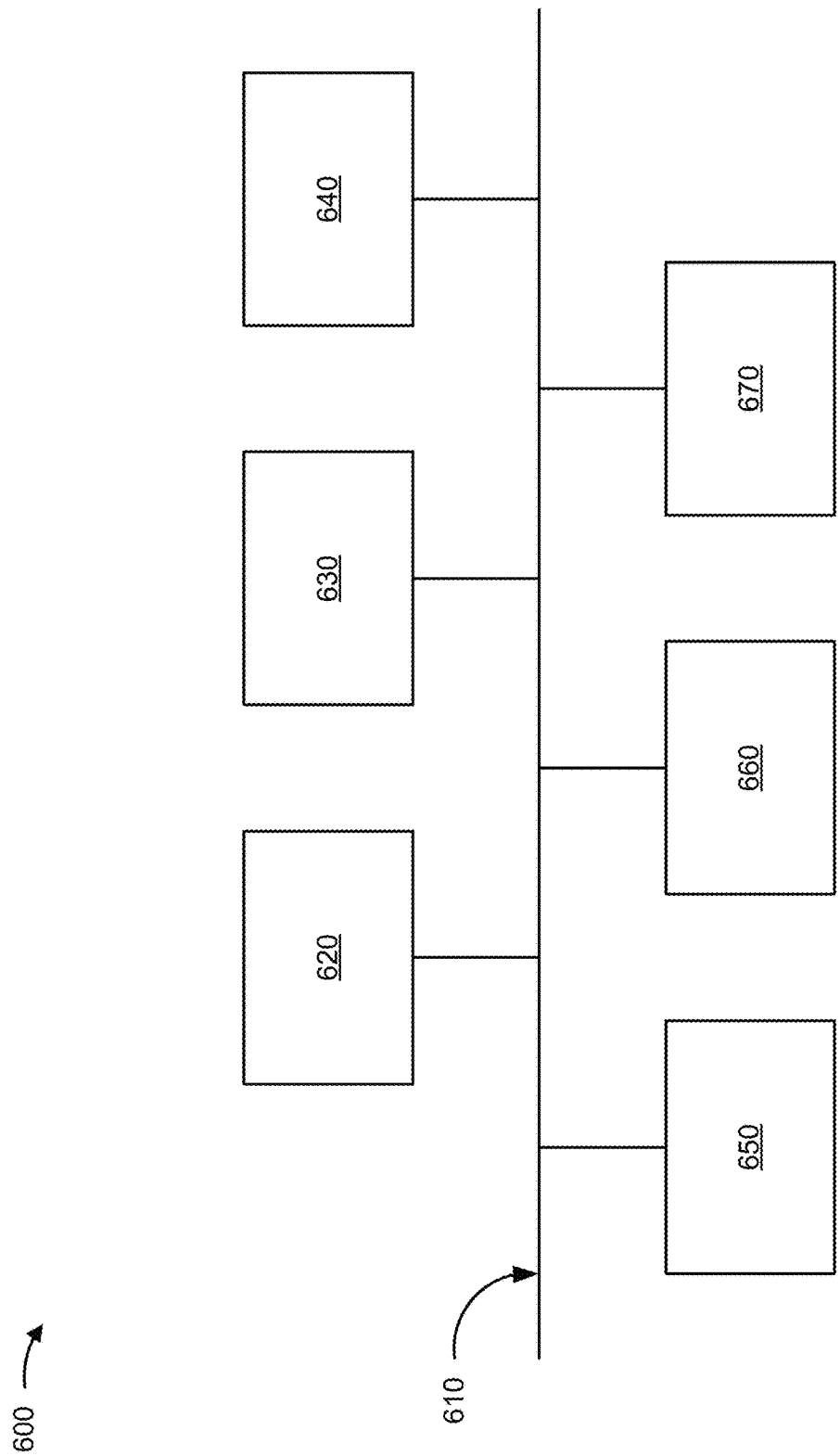
FIG. 6 is a diagram of example components of one or more devices of FIG. 1.

FIG. 6 is a diagram of example components of a device 600, which may correspond to deposition tool 102, etching tool 104, planarization tool 106, ion implantation tool 108, and/or wafer/die transport tool 110. In some implementations, deposition tool 102, etching tool 104, planarization tool 106, ion implantation tool 108, and/or wafer/die transport tool 110 include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Based on disposing the conductive portion 206 of the substrate 202 adjacent to the sidewall(s) of the recessed portion 204 of the substrate 202, the conductive portion 206 may collect and/or drain charge to reduce a charge accumulation within the substrate 202. Based on reducing the charge accumulation within the substrate 202, the semiconductor structure 200/400A/400B may have a reduced parasitic capacitance and/or an increased effective capacitance.

Based on including multiple conductive structures, the semiconductor structure 200/400A/400B may collect and/or drain charge, with improved efficiency, to reduce a charge accumulation within the substrate 202. For example, based on a conductivity of the one or more conductive portions of the substrate 202 and/or a width of the one or more recessed portions 204, multiple conductive structures may collect and/or drain charge from opposite sides of the one or more recessed portions 204 with improved efficiency and/or efficacy when compared with a semiconductor structure having a single conductive structure.

Figure 7:
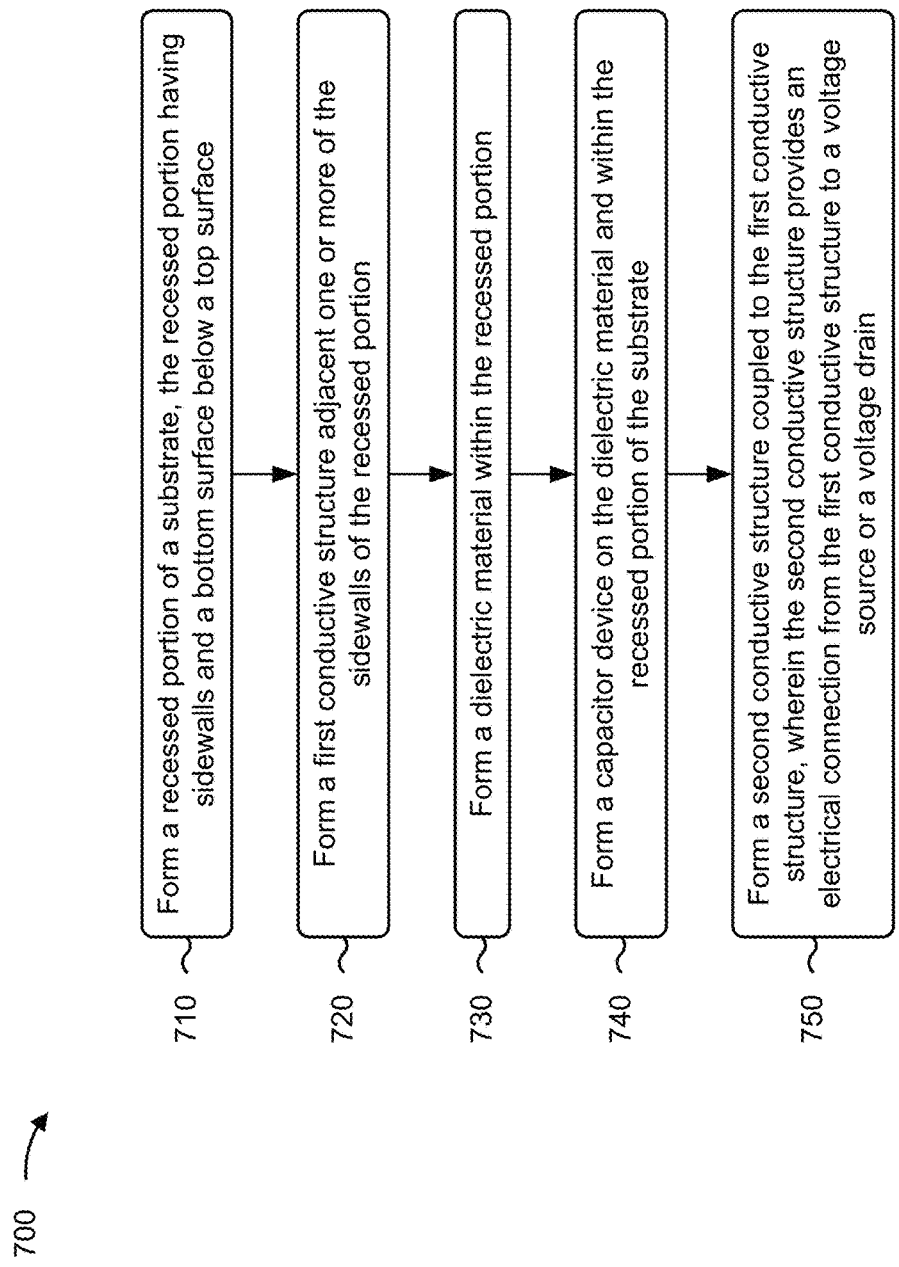
FIG. 7 is a flowchart of an example process relating to forming a semiconductor structure.

FIG. 7 is a flowchart of an example process 700 associated with a capacitor device and manufacturing method thereof. In some implementations, one or more process blocks of FIG. 7 may be performed by a one or more semiconductor processing devices (e.g., deposition tool 102, etching tool 104, planarization tool 106, ion implantation tool 108, and/or wafer/die transport tool 110). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include forming a recessed portion of a substrate, the recessed portion having sidewalls and a bottom surface below a top surface (block 710). For example, the one or more semiconductor processing devices may form a recessed portion 204 of a substrate 202, the recessed portion 204 having sidewalls and a bottom surface below a top surface, as described above.

As further shown in FIG. 7, process 700 may include forming a first conductive structure adjacent one or more of the sidewalls of the recessed portion (block 720). For example, the one or more semiconductor processing devices may form a first conductive structure 206 or 402 adjacent one or more of the sidewalls of the recessed portion 204, as described above.

As further shown in FIG. 7, process 700 may include forming a dielectric material within the recessed portion (block 730). For example, the one or more semiconductor processing devices may form a dielectric material 208, 404A, or 404B within the recessed portion, as described above.

As further shown in FIG. 7, process 700 may include forming a capacitor device on the dielectric material and within the recessed portion of the substrate (block 740). For example, the one or more semiconductor processing devices may form a capacitor device 210 on the dielectric material 208 and within the recessed portion 204 of the substrate 202, as described above.

As further shown in FIG. 7, process 700 may include forming a second conductive structure coupled to the first conductive structure, wherein the second conductive structure provides an electrical connection from the first conductive structure to a voltage source or a voltage drain (block 750). For example, the one or more semiconductor processing devices may form a second conductive structure 212 coupled to the first conductive structure 206 or 402, as described above. In some implementations, the second conductive structure 212 provides an electrical connection from the first conductive structure 206 or 402 to a voltage source or a voltage drain 214.

Process 700 may include additional implementations, such as any single implementation or any combination of implementations described below and/or in connection with one or more other processes described elsewhere herein.

In a first implementation, the first conductive structure 206 or 402 comprises one or more of a conductive portion of the substrate 202, or a conductive material 206 disposed within the recessed portion 204.

In a second implementation, alone or in combination with the first implementation, the conductive material 206 comprises one or more of a titanium-based material, a titanium nitride-based material, a tantalum-based material, or a tantalum nitride-based material.

In a third implementation, alone or in combination with one or more of the first and second implementations, process 700 includes an oxide-based liner 208 disposed between the first conductive structure 206 or 402 and the capacitor device 210.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

As described in greater detail above, some implementations described herein provide a semiconductor structure. The semiconductor structure includes a substrate of the semiconductor structure, the substrate including, a recessed portion having sidewalls and a bottom surface below a top surface of the substrate, and a conductive portion disposed around the recessed portion. The semiconductor structure includes a dielectric material disposed on the conductive portion of the substrate and within the recessed portion. The semiconductor structure includes a capacitor device disposed on the dielectric material within the recessed portion. The semiconductor structure includes a conductive structure coupled to the conductive portion of the substrate, where the conductive structure provides an electrical connection from the conductive portion of the substrate to a voltage source or a voltage drain.

As described in greater detail above, some implementations described herein provide a semiconductor structure. The semiconductor structure includes a first conductive structure disposed within a recessed portion of a substrate of the semiconductor structure, the recessed portion having sidewalls and a bottom surface below a top surface of the substrate. The semiconductor structure includes a dielectric material disposed on the first conductive structure within the recessed portion. The semiconductor structure includes a capacitor device disposed on the dielectric material within the recessed portion. The semiconductor structure includes a second conductive structure coupled to the first conductive structure, where the second conductive structure provides an electrical connection from the first conductive structure to a voltage source or a voltage drain.

As described in greater detail above, some implementations described herein provide a semiconductor structure. The semiconductor structure includes a capacitor device within a recessed portion of a substrate, the recessed portion having sidewalls and a bottom surface below a top surface of the substrate. The semiconductor structure includes a dielectric material disposed below the capacitor device and within the recessed portion. The semiconductor structure includes a first conductive structure adjacent one or more of the sidewalls of the recessed portion. The semiconductor structure includes a second conductive structure coupled to the first conductive structure, where the second conductive structure provides an electrical connection from the first conductive structure to a voltage source or a voltage drain.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate comprising a recessed portion,
      wherein the recessed portion has sidewalls and a bottom surface, the bottom surface of the recessed portion being below a top surface of the substrate;
   a conductive portion around the recessed portion;
   a dielectric material on the conductive portion and within the recessed portion;
   a capacitor device on the dielectric material within the recessed portion;
   a first conductive structure coupled to the conductive portion; and
   a second conductive structure coupled to the conductive portion,
      wherein the first conductive structure provides a first electrical connection from the conductive portion to a voltage source or a voltage drain, and
      wherein the second conductive structure provides a second electrical connection, independent of the first electrical connection, from the conductive portion to the voltage source or voltage drain.

2. The semiconductor structure of claim 1, wherein the dielectric material comprises a low-k dielectric material.

3. The semiconductor structure of claim 1, wherein the conductive portion a doped silicon material.

4. The semiconductor structure of claim 1, wherein the conductive portion directly contacts at least one of one or more sidewalls, of the sidewalls of the recessed portion or the bottom surface of the recessed portion.

5. The semiconductor structure of claim 1, wherein first the conductive structure is laterally displaced from the capacitor device in a first lateral direction, and
   wherein the second conductive structure is laterally displaced from the capacitor device in a second lateral direction with the capacitor device positioned between the first conductive structure and the second conductive structure.

6. The semiconductor structure of claim 1, wherein a voltage of the voltage source is based on a voltage applied to a bottom electrode of the capacitor device.

7. The semiconductor structure of claim 1, wherein the dielectric material is within an additional recessed portion having sidewalls and a bottom surface, the bottom surface of the additional recessed portion being below the top surface of the substrate,
   wherein the capacitor device is on the dielectric material within the recessed portion and the additional recessed portion, and
   wherein the semiconductor structure further comprises an additional conductive portion disposed around the additional recessed portion.

8. The semiconductor structure of claim 7, wherein the conductive structure is coupled to the additional conductive portion.

9. A semiconductor structure, comprising:
   a first conductive structure within a recessed portion of a substrate of the semiconductor structure, the recessed portion having sidewalls and a bottom surface below a top surface of the substrate;
   a dielectric material on the first conductive structure within [he recessed portion;
   a capacitor device on the dielectric material within the recessed portion;
   a second conductive structure coupled to the first conductive structure; and
   a third conductive structure coupled to the first conductive structure,
      wherein the second conductive structure provides a first electrical connection from the first conductive structure to a voltage source or a voltage drain, and
      wherein the third conductive structure provides a second electrical connection, independent of the first electrical connection, from the first conductive structure to the voltage source or the voltage drain.

10. The semiconductor structure of claim 9, wherein the dielectric material comprises a low-k dielectric material.

11. The semiconductor structure of claim 9, further comprising:
   an additional dielectric material between the first conductive structure and the substrate.

12. The semiconductor structure of claim 11, wherein the additional dielectric material comprises a low-k dielectric material.

13. The semiconductor structure of claim 11, wherein the dielectric material comprises a high-k dielectric material that has a k-value that is higher than a k-value of the additional dielectric material.

14. The semiconductor structure of claim 9, wherein the first conductive structure extends along at least one of one or more sidewalls, of the sidewalls of the recessed portion, or the bottom surface of the recessed portion.

15. The semiconductor structure of claim 9, wherein a voltage of the voltage source is based on a voltage applied to a bottom electrode of the capacitor device.

16. The semiconductor structure of claim 9, wherein a voltage of the voltage source is a different value than a value of a first voltage applied to a first set of electrodes of the capacitor device and a value of a second voltage applied to a second set of electrodes of the capacitor device.

17. A semiconductor structure, comprising:
   a capacitor device within a recessed portion of a substrate, the recessed portion having sidewalls and a bottom surface below a top surface of the substrate;
   a dielectric material below the capacitor device and within the recessed portion;
   a first conductive structure adjacent to one or more of the sidewalls of the recessed portion;
   a second conductive structure coupled to the first conductive structure; and
   a third conductive structure coupled to the first conductive structure,
      wherein the second conductive structure provides a first electrical connection from the first conductive structure to a voltage source or a voltage drain, and
      wherein the third conductive structure provides a second electrical connection, independent of the first electrical connection, from the first conductive structure to the voltage source or the voltage drain.

18. The semiconductor structure of claim 17, wherein the first conductive structure comprises one or more of:
   a conductive portion, or
   a conductive material within the recessed portion.

19. The semiconductor structure of claim 18, wherein the conductive material comprises one or more of:
   a titanium-based material,
   a titanium nitride-based material,
   a tantalum-based material, or
   a tantalum nitride-based material.

20. The semiconductor structure of claim 17, further comprising:

an oxide-based liner between the first conductive structure and the capacitor device.

* * * * *